US009046783B2

(12) United States Patent
Misaka et al.

(10) Patent No.: US 9,046,783 B2
(45) Date of Patent: Jun. 2, 2015

(54) PHOTOMASK, AND PATTERN FORMATION METHOD AND EXPOSURE APPARATUS USING THE PHOTOMASK

(71) Applicant: PANASONIC CORPORATION, Osaka (JP)

(72) Inventors: Akio Misaka, Toyama (JP); Masaru Sasago, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 205 days.

(21) Appl. No.: 13/856,836

(22) Filed: Apr. 4, 2013

(65) Prior Publication Data

US 2013/0260293 A1    Oct. 3, 2013

Related U.S. Application Data

(63) Continuation of application No. PCT/JP2012/006929, filed on Oct. 29, 2012.

(30) Foreign Application Priority Data

Mar. 27, 2012   (JP) .................. 2012-070705

(51) Int. Cl.
*G03F 1/38* (2012.01)
*G03F 7/20* (2006.01)

(52) U.S. Cl.
CPC .............. *G03F 1/38* (2013.01); *G03F 7/70691* (2013.01)

(58) Field of Classification Search
CPC ............... G03F 1/20; G03F 1/22; G03F 1/38; G03F 1/144; G03F 7/70433; G03F 7/70441
USPC ............................................... 430/5, 322, 325
See application file for complete search history.

(56) References Cited

U.S. PATENT DOCUMENTS

| 6,159,642 | A | * | 12/2000 | Kawano et al. | .................. 430/5 |
| 2003/0096176 | A1 | | 5/2003 | Miyamae et al. | |
| 2005/0105068 | A1 | | 5/2005 | Komine | |
| 2007/0287073 | A1 | * | 12/2007 | Goodwin | .......................... 430/5 |

FOREIGN PATENT DOCUMENTS

| GB | 2136987 A | 9/1984 |
| JP | 57-054939 A | 4/1982 |
| JP | 59-168445 A | 9/1984 |
| JP | 2-093537 A | 4/1990 |
| JP | 5-182890 A | 7/1993 |
| JP | 2009-277900 A | 11/2009 |

OTHER PUBLICATIONS

International Search Report issued in International Patent Application No. PCT/JP2012/006929 mailed on Nov. 20, 2012.

* cited by examiner

*Primary Examiner* — Stephen Rosasco
(74) *Attorney, Agent, or Firm* — McDermott Will & Emery LLP

(57) ABSTRACT

A photomask includes a translucent substrate; and a light-shielding film formed on the translucent substrate, and including a light-shielding portion and an opening which serves as a translucent region. A plurality of recesses are formed in a region of the translucent substrate, which is exposed from the opening. Widths of the plurality of recesses gradually increase with an increase in distances from a focal point so that light transmitted by the plurality of recesses is focused in a predetermined position.

25 Claims, 23 Drawing Sheets

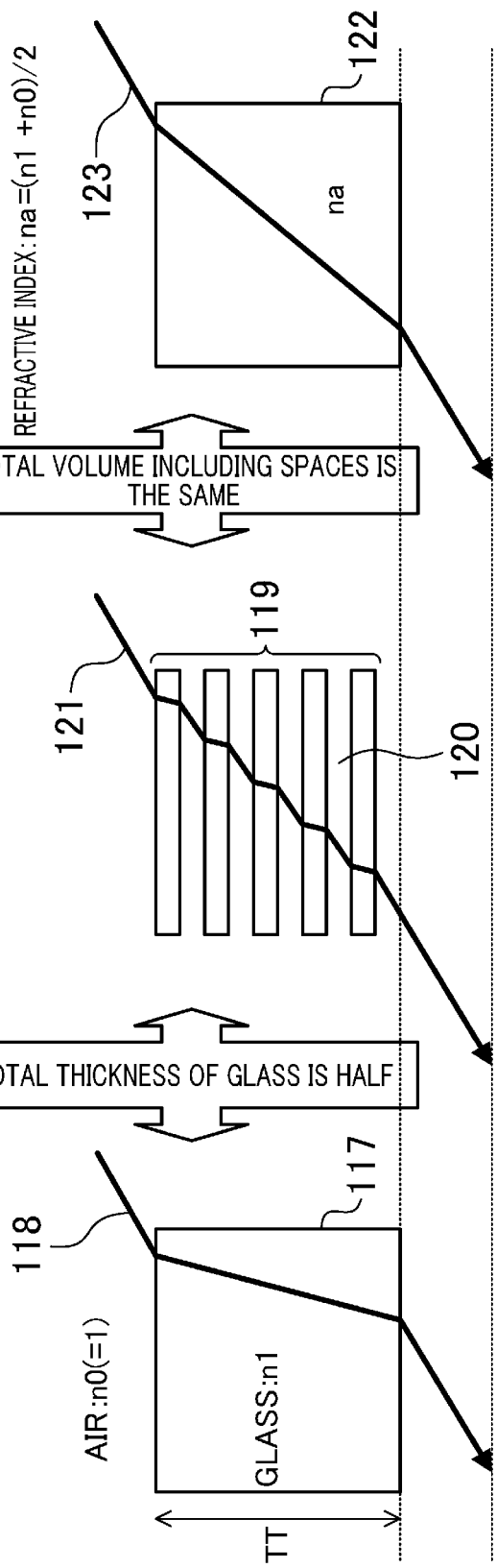

FIG.10

| NUMBER | DISTANCE FROM LINE IXa-IXa | WIDTH OF RECESS |
|---|---|---|
| 1 | 3.40 λ | 0.11 λ |
| 2 | 4.36 λ | 0.16 λ |
| 3 | 5.32 λ | 0.25 λ |
| 4 | 6.25 λ | 0.33 λ |
| 5 | 7.18 λ | 0.44 λ |
| 6 | 8.11 λ | 0.55 λ |
| 7 | 9.04 λ | 0.68 λ |
| 8 | 9.95 λ | 0.82 λ |
| 9 | 10.88 λ | 0.99 λ |

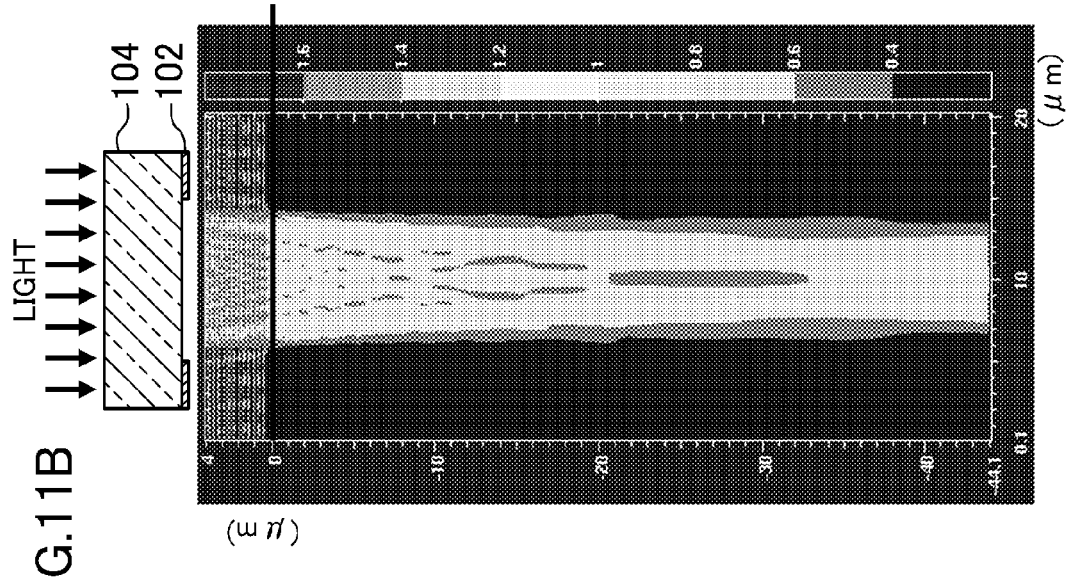
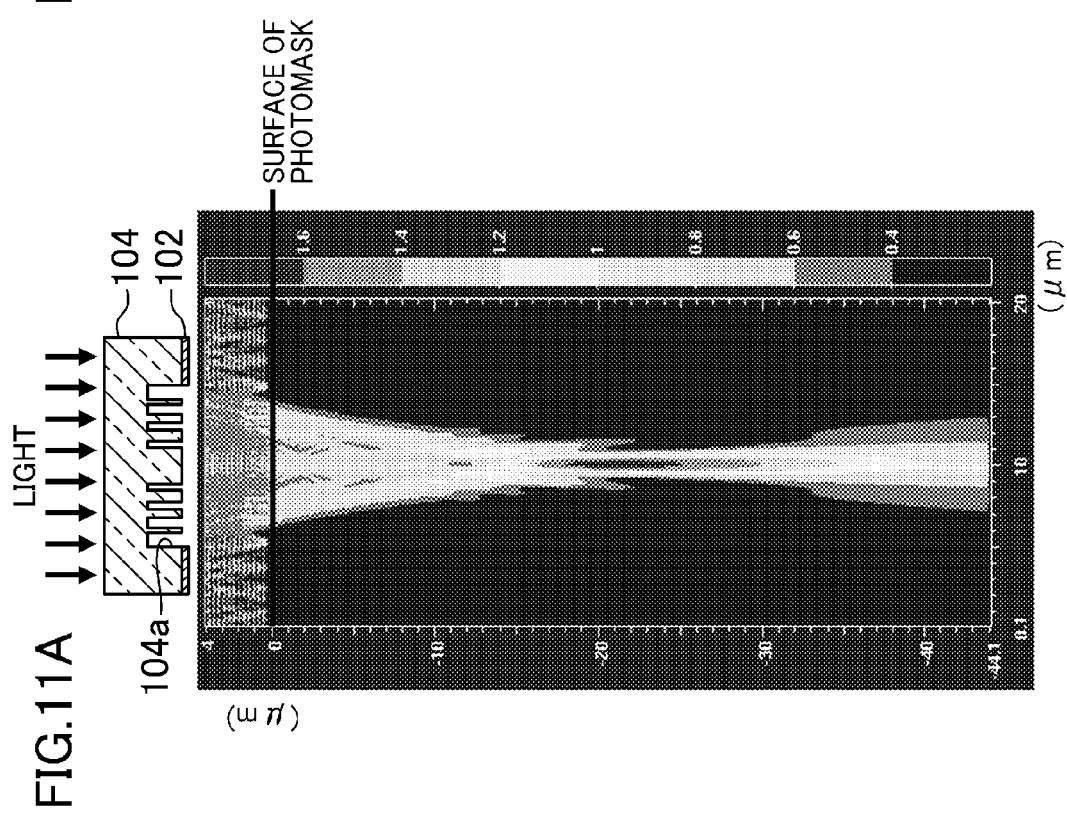

PHOTOMASK, AND PATTERN FORMATION METHOD AND EXPOSURE APPARATUS USING THE PHOTOMASK

CROSS-REFERENCE TO RELATED APPLICATIONS

This is a continuation of International Application No. PCT/JP2012/006929 filed on Oct. 29, 2012, which claims priority to Japanese Patent Application No. 2012-070705 filed on Mar. 27, 2012. The entire disclosures of these applications are incorporated by reference herein.

BACKGROUND

The present disclosure particularly relates to photomasks used for proximity exposure, and pattern formation methods and exposure apparatuses using the photomasks.

In microfabrication of semiconductor integrated circuits, MEMS processing, and surface processing of flat panels such as liquid crystal panels, lithography is used, in which pattern exposure is performed on a photosensitive resin layer formed on a substrate to be processed, and the exposed photosensitive resin layer is developed to form a desired pattern. In lithography, an object is generally irradiated with light via a photomask with a pattern. At this time, in order to reduce damages caused by close contact between a photomask and a body to be exposed, exposure is performed with the photomask spaced apart from the body to be exposed, i.e., proximity exposure is often performed.

However, in this case with the space, even if a pattern in a size about several times the wavelength is formed on a mask to form a fine pattern in a size about several times the exposure wavelength, a pattern in a desired size cannot be formed on a substrate due to the Fresnel diffraction etc.

For example, as shown in FIG. 23, in exposure using an exposure photomask 203 including a light-shielding film 202 formed on a transparent substrate 201, exposure light 204 transmitted by the photomask 203 is diffracted, thereby blurring a pattern. Even in projection exposure, in which a lens is provided between the photomask 203 and a substrate 205 to be processed, an opening 203a in a size about several times the wavelength of the photomask 203 does not transmit sufficient light in same-size projection exposure. Therefore, a fine pattern is difficult to form.

In recent years, reduced projection exposure has been suggested, in which a reducing lens is provided as the projection lens between the photomask 203 and the substrate 205, and a mask in a size four or five times the size after processing is used to increase the size of a pattern on the mask, thereby forming a fine pattern. However, in the reduced projection exposure, the entire exposure area is reduced to make processing of a large-area substrate difficult. In addition, the reduced projection exposure requires a plurality of high-precision lens for reduction, thereby increasing the costs for an apparatus for exposure.

In same-size projection exposure using proximity exposure or projection exposure, a method of forming a pattern in a desired size by increasing the intensity of light transmitted by a minute opening in a size about several times the wavelength.

Formation of a pattern, which is smaller than a limit for exposure by lithography using a photomask 203, will be described below with reference to FIGS. 24A and 24B. (See, for example, Japanese Patent Publication No. S57-054939)

First, as shown in FIG. 24A, the photomask 203 includes a glass substrate 207, and a light-shielding film 208 formed on the glass substrate 207 and having an opening 208a, which is a fine pattern portion. The photomask 203 includes a high refractive region 209, which has a higher refractive index than the glass substrate 207, in and near the region of the glass substrate 207, which is exposed from the opening 208a. Where the glass substrate 207 is made of, for example, silicon oxide, the refractive index is 1.5. When, for example, titanium (Ti) is added to the high refractive region 209, the refractive index becomes 1.8. The light-shielding film 208 is a vapor deposited film made of, for example, chrome (Cr).

As clear from FIG. 24B, the high refractive region 209 serves as a convex lens in the opening 208a, which is a light path of exposure light when being transmitted by the photomask 203. This collects the light passing through the region around the opening 208a so that the intensity of light transmitted by the fine pattern portion 208a becomes higher than the intensity of light passing through the normal mask portion. As a result, a fine pattern is formed.

Japanese Patent Publication No. S57-054939 shows that the high refractive region 209 is formed by ion implantation etc. to implant highly polarizable ions into and around the opening 208a of the light-shielding film 208 on the glass substrate 207.

SUMMARY

However, in order to sufficiently collect exposure light using a photomask, the refractive index needs to continuously change in and around an opening not only to simply increase the refractive index in the entire opening of the photomask, but also to provide a gradient index lens.

In the conventional photomask, it is extremely difficult to form the region doped with the highly polarizable ions in and around the opening so as to increase the refractive index of the glass substrate, and to continuously change the refractive index around the single opening to obtain the function of a gradient index lens. Therefore, the conventional technique cannot collect sufficient light in a desired focal point.

In view of the problem, it is an objective of the present disclosure to collect sufficient light transmitted by an opening to form a fine pattern.

In order to achieve the objective, the present disclosure provides a photomask, in which a plurality of recesses are formed in a region exposed from an opening, so that light is focused in a desired position.

Specifically, a photomask according to a first aspect of the present disclosure includes a translucent substrate; and a light-shielding film formed on the substrate, and including a light-shielding portion and an opening which serves as a translucent region. A plurality of recesses are formed in a region of the substrate, which is exposed from the opening. Widths of the plurality of recesses gradually increase with an increase in distances from a focal point so that light transmitted by the plurality of recesses is focused in a predetermined position.

In the photomask according to the first aspect, the widths of the plurality of recesses gradually increase with an increase in the distances from the focal point so that the light transmitted by the plurality of recesses is focused in the predetermined position. In the opening provided in the light-shielding film, the light transmitted by the plurality of recesses is refracted toward a non-recessed portion adjacent to the recesses at the inner side of the recesses. This configuration efficiently collects the light toward the center of the opening.

In the photomask according to the first aspect, the plurality of recesses are preferably linearly patterned along two facing sides of the opening A first recess of an adjacent pair of the recesses, which is closer to a boundary between the light-shielding portion and the opening preferably has a greater width than a second recess, which is farther from the boundary.

With this configuration, the light transmitted by the periphery of the opening is refracted more greatly than the light transmitted by the inner side of the opening, thereby reliably collecting the light toward the center of the opening.

In this case, the width of the second recess may be 0.9 times or less the width of the first recess. This configuration reliably changes the direction of the refracted light.

In this case, the width of the first recess may be twice or less an exposure wavelength. This configuration enables adjustment of the angle of the refracted light.

In this case, the width of the second recess may be smaller than or equal to an exposure wavelength. This configuration enables more precise adjustment of the angle of the refracted light.

In this case, the width of the first recess and the width of the second recess may be smaller than or equal to an exposure wavelength. This configuration facilitates pattern design capable of adjusting the angle of the refracted light.

In this case, a distance between the first and the second recesses may be smaller than or equal to an exposure wavelength. This configuration precisely collects light in a desired focal point.

In this case, a sum of a distance between the first and the second recesses and the width of the second recess may be smaller than or equal to an exposure wavelength. This configuration facilitates pattern design capable of precisely collecting light in a desired focal point.

In this case, a distance between the first recess and the boundary may be smaller than or equal to an exposure wavelength. This configuration effectively collects the light transmitted by the opening.

In this case, the first recess may be in contact with the boundary. This configuration collects almost all the light transmitted by the opening.

In the photomask according to the first aspect, a first recess of the plurality of recesses may be linearly patterned along two facing sides of the opening. Each of second recesses of the plurality of recesses may be formed of a group of patterns, each of which has an area of λ×λ or less, where λ is an exposure wavelength. The first recess may be located closer to a boundary between the light-shielding portion and the opening. The second recesses may be located farther from the boundary with the first recess interposed therebetween.

With this configuration, the light transmitted by the periphery of the opening is refracted more greatly than the light transmitted by the inner side of the opening, thereby reliably collecting the light toward the center of the opening.

In this case, a distance between each adjacent pair of the second recesses may be smaller than or equal to an exposure wavelength. This configuration facilitates the formation of the recesses capable of precisely adjusting the angle of the refracted light.

In this case, a distance between each adjacent pair of the first and second recesses may be smaller than or equal to an exposure wavelength. This configuration facilitates pattern design capable of adjusting the angle of the refracted light.

In this case, a distance between the first recess and the boundary may be smaller than or equal to an exposure wavelength. This configuration effectively collects the light transmitted by the opening.

In the photomask according to the first aspect, each of the plurality of recesses may be formed of a group of patterns, each of which has an area of λ×λ or less, where λ is an exposure wavelength. A first recess of the plurality of recesses may have a greater total area than a second recess of the plurality of recesses. The first recess may be located closer to a boundary between the light-shielding portion and the opening. The second recess may be located farther from the boundary with the first recess interposed therebetween.

With this configuration, the light transmitted by the periphery of the opening is refracted more greatly than the light transmitted by the inner side of the opening, thereby reliably collecting the light toward the center of the opening.

In this case, a distance between each adjacent pair of the first and second recesses may be smaller than or equal to an exposure wavelength. This facilitates the formation of the recesses capable of precisely adjusting the angle of the refracted light.

A photomask according to a second aspect of the present disclosure includes a translucent substrate; and a light-shielding film formed on the substrate, and including a light-shielding portion and an opening which serves as a translucent region. A plurality of recesses are formed in a region of the substrate, which is exposed from the opening. Widths of first recesses of the plurality of recesses gradually increase with an increase in distances from a first focal point so that light transmitted by the first recesses is focused in a predetermined position. Widths of second recesses of the plurality of recesses gradually increase with an increase in distances from a second focal point, which is different from the first focal point, so that light transmitted by the second recesses is focused in another predetermined position.

In the photomask according to the second aspect, the widths of first recesses of the plurality of recesses gradually increase with an increase in the distances from the first focal point so that the light transmitted by the first recesses is focused in the predetermined position. The widths of second recesses of the plurality of recesses gradually increase with an increase in the distances from the second focal point, which is different from the first focal point, so that the light transmitted by the second recesses is focused in the other predetermined position. Thus, in the opening provided in the light-shielding film, the light transmitted by the first recesses is refracted toward the non-recessed portion adjacent to the first recesses at the inner side of the first recesses. Also, the light transmitted by the second recesses is refracted toward the non-recessed portion adjacent to the second recesses at the inner side of the second recesses. This configuration efficiently collects the light toward the first and second focal points.

In the photomask according to the second aspect, the plurality of recesses are preferably linearly patterned along two facing sides of the opening. One of an adjacent pair of the first recesses, which is closer to a boundary between the light-shielding portion and the opening, preferably has a greater width than the other one, which is farther from the boundary. One of an adjacent pair of the second recesses, which is closer to the boundary, preferably has a greater width than the other one, which is farther from the boundary.

With this configuration, the light transmitted by the periphery of the opening is refracted more greatly than the light transmitted by the inner side of the opening, thereby reliably collecting the light toward the two focal points.

In the photomask according to the second aspect, each of the plurality of recesses is preferably formed of a group of patterns, each of which has an area of λ×λ or less, where λ is an exposure wavelength. One of an adjacent pair of the first recesses, which is closer to a boundary between the light-shielding portion and the opening, preferably has a greater total area than the other one, which is farther from the boundary. One of an adjacent pair of the second recesses, which is closer to the boundary, has a greater total area than the other one, which is farther from the boundary.

With this configuration, the light transmitted by a position apart from a desired pattern can be largely refracted, thereby uniformly collecting the light toward the center of the opening.

In the photomask according to the first or second aspect, a depth of the recesses may be greater than half an exposure wavelength. This configuration reliably refracts light transmitted by the recesses.

A pattern formation method according to the present disclosure uses the photomask of the first or second aspect. The method includes forming a resist film on a substrate to be exposed to light; irradiating the resist film with exposure light via the photomask; and forming a resist pattern by developing the resist film irradiated with the exposure light.

In the pattern formation method according to the present disclosure, the photomask according to the present disclosure is used in the exposure to collect the light transmitted by the photomask, thereby forming a fine pattern.

An exposure apparatus according to the present disclosure uses the photomask of the first or second aspect. The photomask is a cylindrical mask substrate, in which a hollow having a light source of exposure light inside is provided. The apparatus includes a rotation mechanism configured to rotate the photomask; and a transfer mechanism configured to transfer a substrate to be exposed to light relative to the photomask. The substrate to be exposed to light is exposed, while the rotation mechanism rotates the photomask, and the transfer mechanism transfers the substrate to be exposed to light.

In the exposure apparatus according to the present disclosure, light is collected at a predetermined distance apart from the cylindrical photomask, thereby forming a fine pattern in a large area.

In the photomask according to the present disclosure, and the pattern formation method and the exposure apparatus using the photomask, light transmitted by the opening of the photomask is sufficiently collected, thereby forming a fine pattern.

BRIEF DESCRIPTION OF THE DRAWINGS

FIG. 1A is a bottom view. FIG. 1B is a cross-sectional view taken along the line Ib-Ib of FIG. 1A.

FIGS. 6A-6C illustrate substantial refractive indexes of a glass including air layers.

FIG. 7A is a top view. FIG. 7B is a cross-sectional view.

FIG. 10 is a table illustrating example data of recesses provided in the photomask according to the experiment.

FIG. 11A illustrates a simulation result showing the intensity distribution of light transmitted by the photomask according to the experiment. FIG. 11B illustrates a simulation result showing the intensity distribution of light transmitted by the photomask according to a comparison example.

FIG. 18A is a bottom view. FIG. 18B is a cross-sectional view taken along the line XVIIIb-XVIIIb of FIG. 18A.

DETAILED DESCRIPTION

First Embodiment

A photomask according to a first embodiment will be described below with reference to the drawings.

Figure 1A:
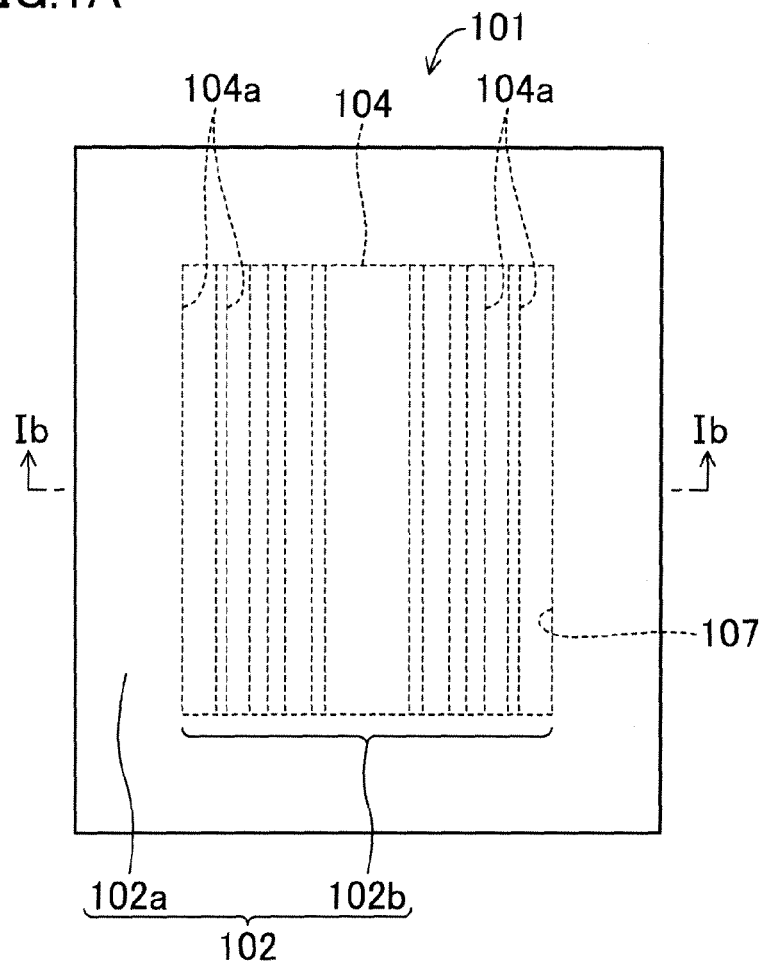
FIGS. 1A and 1B illustrate an example photomask according to a first embodiment.
Figure 1B:
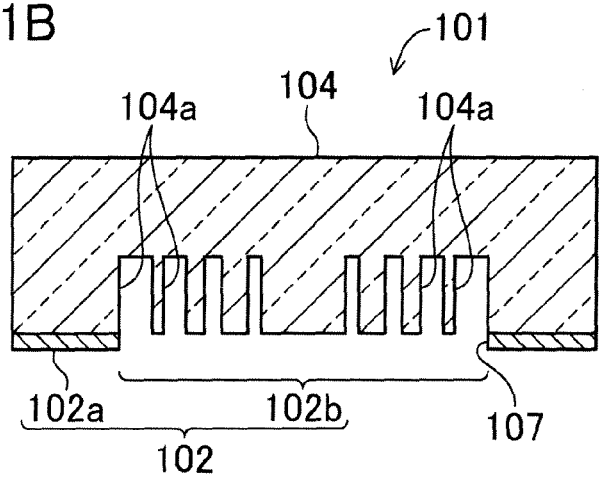

As shown in FIGS. 1A and 1B, a photomask 101 according to the first embodiment includes a translucent substrate 104 made of, for example, glass, and a light-shielding film 102, which is formed under the translucent substrate 104, and includes a light-shielding portion 102a and an opening 102b serving as a translucent region. The light-shielding film 102 may be, for example, a vapor deposited film made of chrome (Cr).

One of the features of the photomask 101 according to the first embodiment is that a plurality of linear recesses 104a with different widths are provided in a region of the glass 104 which is exposed from the opening 102b. These recesses 104a are provided in parallel with a frame 107, which is a boundary between the light-shielding portion 102a and the opening 102b in the opening 102b. The widths of the recesses 104a gradually decrease from the frame 107 to the center of the opening 102b.

As long as not particularly mentioned, the translucent substrate 104 is regarded as a glass 104. However, the translucent substrate 104 is not limited to a glass.

First Variation of First Embodiment

Figure 2:
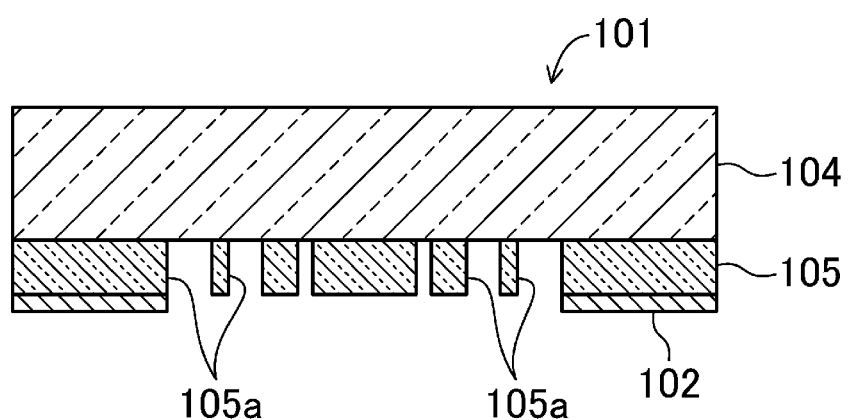
FIG. 2 is a cross-sectional view of an example photomask according to a first variation of the first embodiment.

FIG. 2 illustrates the cross-section of a photomask 101 according to a first variation of the first embodiment. As shown in FIG. 2, a high refractive film 105 made of a high refractive material is interposed between a glass 104 and a light-shielding film 102. As shown in FIG. 2, in the photomask 101 according to the first variation, a plurality of recesses 105a are provided in the high refractive film 105. As such, the present disclosure is also applicable to the configuration in which the high refractive film 105 is interposed between the glass 104 and the light-shielding film 102.

In this variation, the glass 104 and the high refractive film 105 are in combination referred to a translucent substrate 104.

Figure 3A:
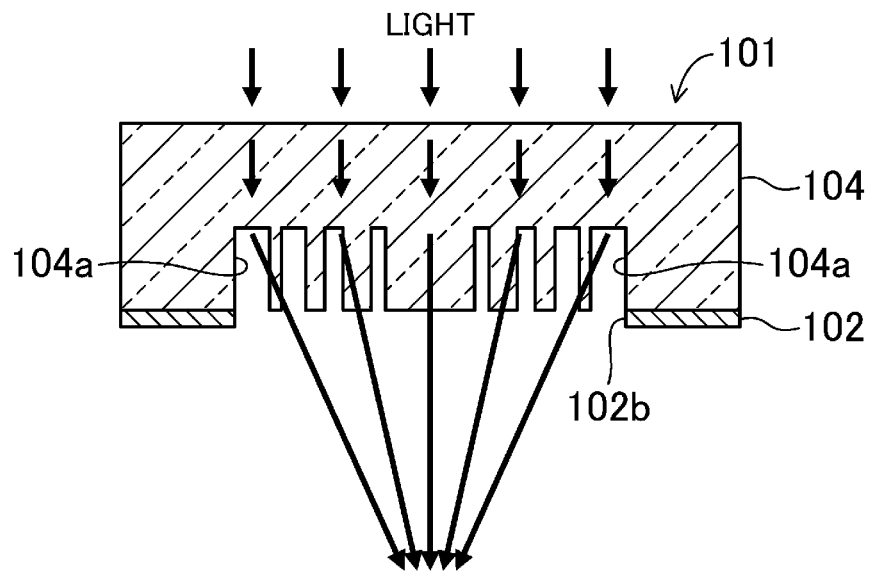
FIG. 3A is a cross-sectional view illustrating collection of exposure light using the photomask according to the first embodiment.
Figure 3B:
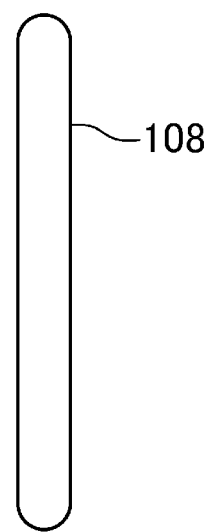
FIG. 3B is a top view of a pattern formed by using the photomask according to the first embodiment.

FIGS. 3A and 3B illustrate light refraction when the photomask 101 is irradiated with light from the upper surface (i.e., the back surface).

As long as not particularly mentioned, the description assumes exposure light, which is called i-ray with a wavelength of 365 nm in a high-pressure mercury lamp, and is most commonly used as light in lithography. However, the principles of light refraction, which will be described below, are not limited to the i-ray, and are also applicable to, for example, a g-ray with a wavelength of 436 nm in a high-pressure mercury lamp, a KrF excimer laser beam with a wavelength of 256 nm, an ArF excimer laser beam with a wavelength of 193 nm, or light with a wavelength of 193 nm or less.

As shown in FIG. 3A, parallel light used to irradiate the photomask 101 from the back surface to the front surface is transmitted by the inside of the glass 104, while keeping the parallel state. However, in the photomask 101, when the light is transmitted by the plurality of recesses 104a, the light is refracted from the recesses 104a with greater widths to the recesses 104a with smaller widths, thereby changing the direction of the light.

As a result, the light transmitted by the opening 102a is collected around the center of the linear opening 102b at a predetermined distance apart from the back surface of the photomask 101. Thus, when exposure is performed via the photomask 101, a linear pattern 108 with a width of 1 μm or less is clearly formed below the center of the opening 102a of the photomask 101, even in a position about tens of μm apart from the front surface of the photomask 101, as shown in FIG. 3B.

A reason for the phenomenon will be described below. Before specifically describing the behavior of light transmitted by the photomask 101, the behavior of conventional light will be described.

Figure 4:
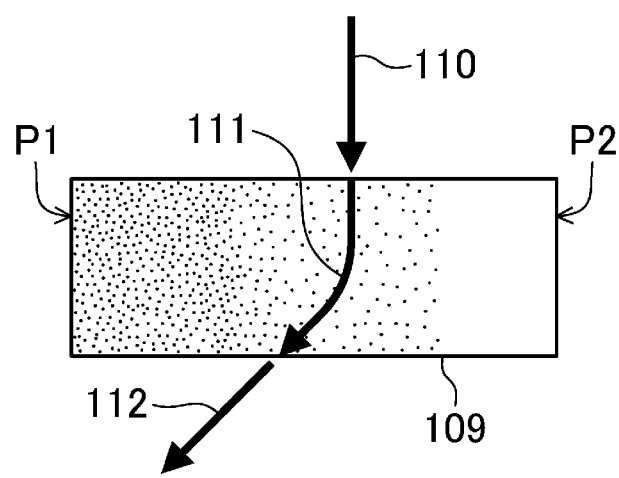
FIG. 4 is a schematic cross-sectional view illustrating a path of light when being transmitted by a gradient index transparent body.

FIG. 4 illustrates the behavior of light transmitted by a gradient index transparent body 109, in which the refractive index differs from position to position. In the transparent body 109 of FIG. 4, the refractive index is distributed in the direction perpendicular to the incident direction of the light. Specifically, the transparent body 109 is made of a material in which the refractive index gradually increases from a right end P2 to a left end P1. When the light indicated by a first light path 110 is incident on the transparent body 109, the direction of the light bends in the transparent body 109 from the low refractive side to the high refractive side, i.e., from the P2 to the P1, as indicated by a second light path 111. This phenomenon is well known. Then, the light transmitted by the transparent body 109 goes straight to a new direction as indicated by a third light path 112.

Figure 5A:
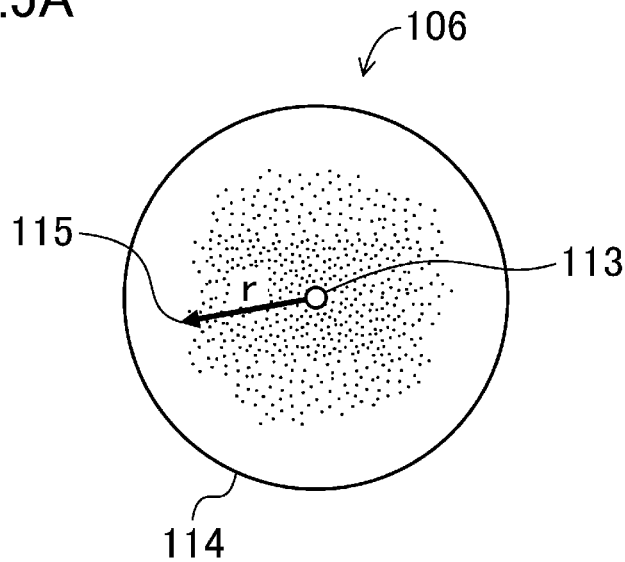
FIG. 5A is a schematic top view of a gradient index lens.
Figure 5B:
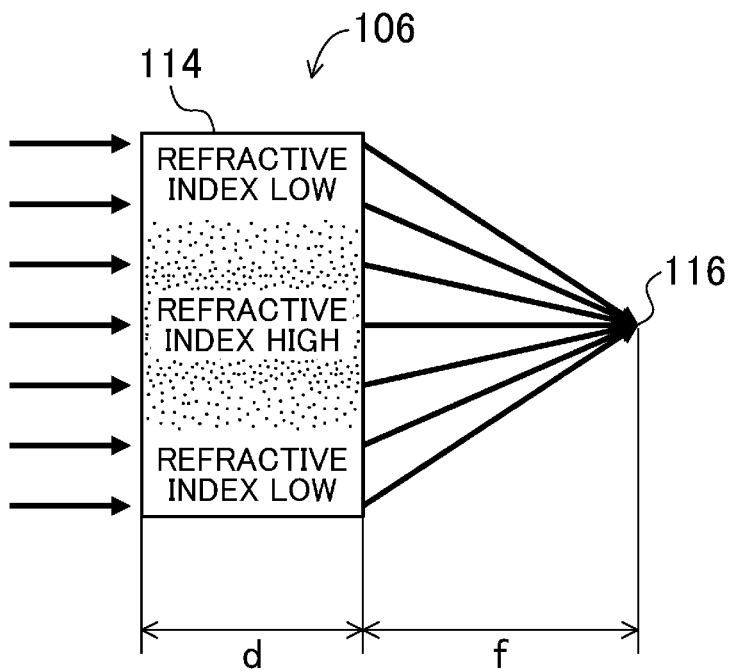
FIG. 5B is a schematic cross-sectional view illustrating light refraction in the gradient index lens.

FIGS. 5A and 5B illustrate a gradient index lens utilizing the behavior of light bending its path from a low refractive region to high refractive region of a substance as described above. FIG. 5A is a plan view of a gradient index lens 106 as viewed from the incident direction of the light. As shown in FIG. 5A, the refractive index gradually increases toward a center 113 in the gradient index lens 106 in a circular planer shape. That is, the gradient index lens 106 has the lowest refractive index in a peripheral portion 114. FIG. 5B is a cross-sectional view of the gradient index lens 106. As shown in FIG. 5B, the gradient index lens 106 has a flat plate-like shape along the direction of light. The light transmitted by the peripheral portion 114 of the lens is refracted toward the center so that the lens serves the function of collecting light. At this time, in a disk-shaped lens as viewed from above, where the refractive index in the center of the circle is NC, the refractive index in a position 115 at a distance of a radius r apart from the center of the circle is n(r), and the thickness of the lens in the direction of the light is d, the refractive index is changed in the direction of the radius r to satisfy the following equation (1). Then, the light transmitted by the lens has a focal point 116 at a distance of f apart from the lens.

$$n(r)=NC-r\times r/2/f/d \quad (1)$$

The photomask 101 according to this embodiment utilizes the principles of the gradient index lens 106 to collect light transmitted by the opening 102b of the photomask 101. In the gradient index lens 106, for example, the glass 104 is melted to control inside ion distribution, thereby forming distribution of the refractive index inside the glass 104.

By contrast, the present inventors have found how to form substantial refractive index distribution inside the glass 104 by providing in the glass 104, the recesses 104a in sizes of about the exposure wavelength.

First, the principles of changing the substantial refractive index of a glass by forming recesses in the glass will be described with reference to FIGS. 6A-6C.

A first transparent body 117 shown in FIG. 6A is a glass 104 with a thickness of TT and a refractive index of n1. A first light path 118 represents the refraction of light incident on the first transparent body 117.

A second transparent body 119 shown in FIG. 6B includes thin glass layers 104 having the same composition as the first transparent body 117. Spaces are formed by interposing an air layer 120 with the same thickness as the glass layer 104 between each pair of the glass layers. The total thickness of the glass layers 104 and the air layers 120 is TT, which is the same thickness as the first transparent body 117. A second light path 121 represents the refraction of light incident on the second transparent body 119.

A third transparent body 122 shown in FIG. 6C is made of a transparent material with a thickness of TT and a refractive index represented by the equation, na=(n1+n0)/2. The reference character n0 is the refractive index of the air layers 120. A third light path 123 represents the refraction of light incident on the third transparent body 122.

Under these conditions, the paths of the light incident on the second transparent body 119 and the third transparent body 122 after being transmitted by the transparent bodies are identical as viewed from the outside. That is, as viewed from the outside, the second transparent body 119 and the third transparent body 122 behave as if they have the same refractive index of light. Indeed, the incident light does not suddenly bend, but changes its direction while going forward by a distance corresponding to the wavelength.

Therefore, the second transparent body 119 shown in FIG. 6B is considered to behave similarly to the third transparent body 122 shown in FIG. 6C inside the substance by reducing the thicknesses of the glass layers 104 and the air layers 120 to about the wavelength, i.e., at most, twice or less the wavelength.

Therefore, a transparent body, in which two or more substances with different refractive indexes are mixed, can be handled as a substance with a uniform refractive index of light, which is the intermediate value between the refractive indexes of the mixed substances. At this time, the intermediate value of the refractive indexes is referred to as a substantial refractive index. While the second transparent body 119 has here the same thickness as the total thickness of the glass layers 104 and the air layers 120, the thickness is not limited thereto.

For example, where the glass layers 104 have a thickness GD and the air layers 120 have a thickness of AD, the substantial refractive index na of the second transparent body 119 is approximated by the following equation (2).

$$na=(n1 \times GD + n0 \times AD)/(GA+AD) \quad (2)$$

In a material including two types of substances with different refractive indexes, the substantial refractive index of the material is close to the refractive index of the one of the substances whose composition ratio is higher the other. Since the glass layers 104 usually have a refractive index of about 1.5, and the air layers 120 have a refractive index of 1, the substantial refractive index decreases with an increase in the thickness of the air layers. Where the sum of the thicknesses GD and AD, which are the thicknesses of the glass layers 104 and the air layers 120, respectively, i.e., (GD+AD), is about twice or less the wavelength, the approximation is sufficiently valid. In addition, if both the GD and AD are smaller than or equal to the wavelength, the accuracy of the approximation improves. Therefore, it is more preferable that both the GD and AD are smaller than or equal to the wavelength.

If the (GD+AD) is smaller than or equal to the wavelength, the substantial refractive index inside the substance is uniformly obtained as follows.

$$na=(n1 \times GD + n0 \times AD)/(GA+AD)$$

Therefore, the material is substantially the same as a substance with a uniform refractive index na of light.

Figure 7A:
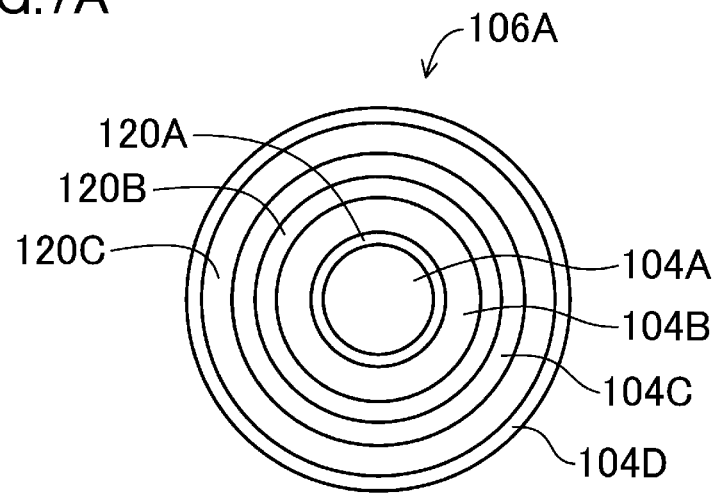
FIG. 7A and FIG. 7B illustrate a gradient index lens utilizing the thicknesses of glass layers and air layers.
Figure 7B:
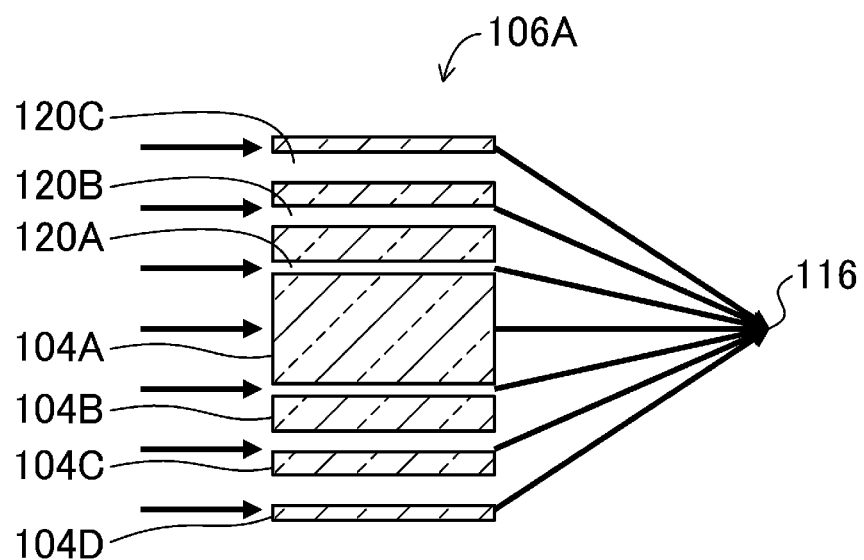

FIGS. 7A and 7B illustrate a gradient index lens 106A including glass layers 104 and air layers 120 utilizing the above-described principles. FIG. 7A is a plan view of the gradient index lens 106A as viewed from the incident direction of light. FIG. 7B is a cross-sectional view.

As shown in FIGS. 7A and 7B, in the gradient index lens 106A, glass layers 104A, 104B, 104C, and 104D are sequentially provided from the inner side. Air layers 120A, 120B, and 12C are concentrically arranged between each pair of the glass layers 104A, 104B, 104C, and 104D. The glass layers 104A, 104B, 104C, and 104D are also concentrically arranged so that the gradient index lens 106A has a cylindrical shape.

The thicknesses of the sidewalls of the cylindrical glass layers 104B, 104C, and 104D gradually decrease in this order. By contrast, the thicknesses of the sidewalls of the air layers between respective pairs of the cylindrical glass layers 104B, 104C, and 104D gradually increase in the order of 120A, 120B, and 120C.

At this time, if the thicknesses of the glass layer 104A, etc. and the air layer 120A, etc. are smaller than or equal to the wavelength of light, the substantial refractive index is higher in the center of the circular lens, and lower in the peripheral portion. Therefore, the gradient index lens 106A serves similarly to the gradient index lens 106 shown in FIG. 5 in response to incident light.

As a result, similar to the gradient index lens 106, transmitted light is focused in the focal point 116 by controlling the thicknesses of the glass layer 104A, etc. and the air layer 120A, etc. so that the substantial refractive index satisfies the equation (1).

Figure 8:
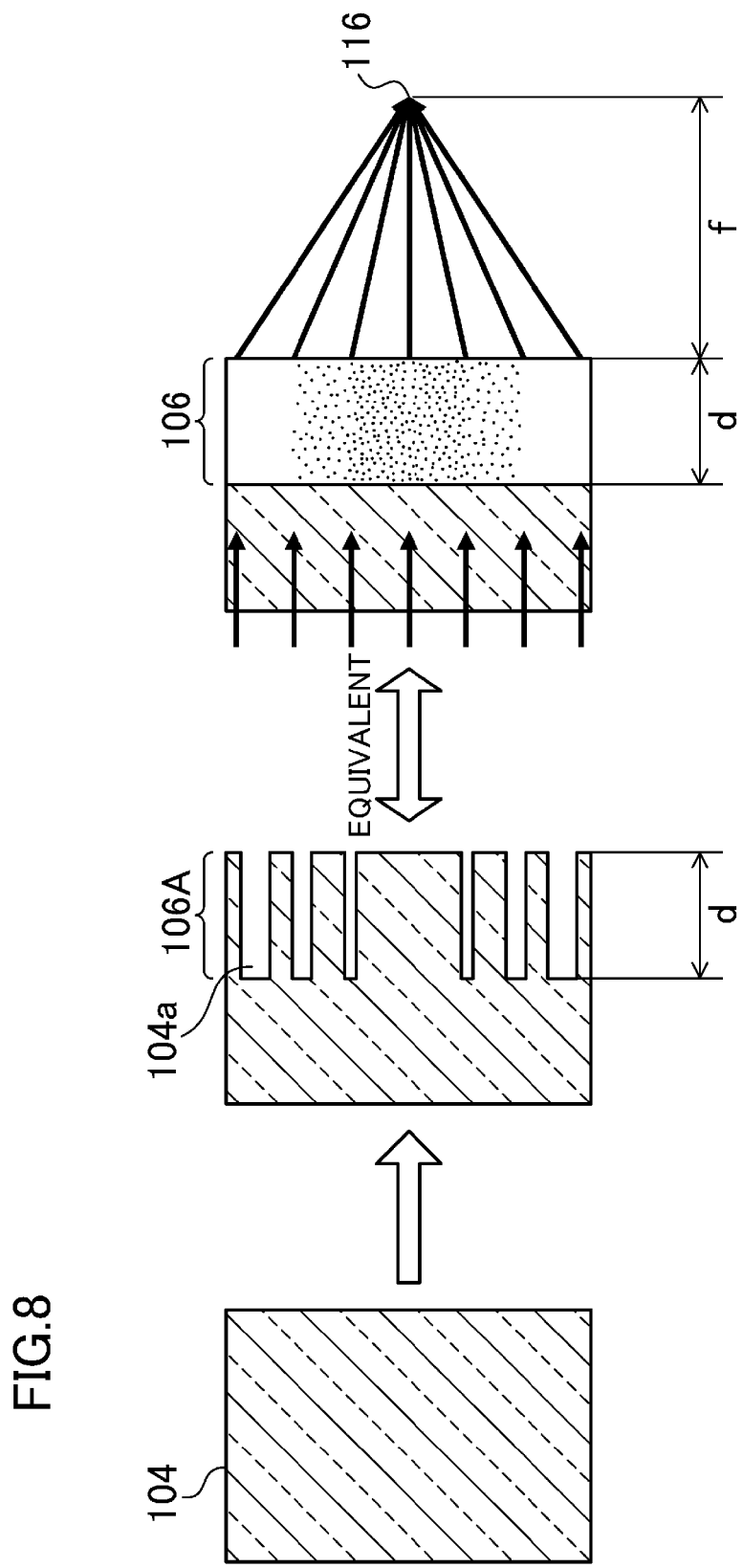
FIG. 8 is a schematic cross-sectional view illustrating formation of a gradient index lens by forming spaces of air layers in a surface of a glass.

FIG. 8 illustrates example formation of the gradient index lens 106A formed by processing a glass. First, portions corresponding to the air layers 120A, 120B, and 12C of FIG. 7A are recessed from one of principal surfaces of the glass 104 by etching, etc. At this time, the substantial refractive index (na) and the depth d of the recesses are determined to satisfy the equation (1).

As such, when the gradient index lens 106A with the plurality of recesses 120A, etc. is perpendicularly irradiated with light from the back surface, the light goes straight in the region of the glass 104 without the recesses 104a. On the other hand, in the region of the glass 104 with the recesses 104a, the light is refracted while being transmitted by a portion corresponding to the glass portion 104A, etc., which is adjacent to one of the recesses 104a. Then, the light is collected in the predetermined focal point 116. That is, as shown in FIG. 8, this configuration apparently is the same as the combination of the glass 104 and the gradient index lens 106, which are connected in series.

Based on these basic principles, the points of the configuration of the photomask according to this embodiment shown in FIG. 1 will be described.

In the photomask 101 shown in FIG. 1, the plurality of recesses 104a are formed in the region of the glass 104, which is a substrate, from the opening 102b of the light-shielding film 102. The patterns of the recesses 104a are formed so that the substantial refractive index gradually increases from the frame 107 of the opening 102b toward the center of the opening 102b.

That is, as shown in FIGS. 1A and 1B, the photomask 101 according to this embodiment has at least two recesses 104a, each of which has a linear pattern formed along the frame 107 of the opening 102b. Out of two recesses 104a formed in parallel with a single glass portion interposed therebetween, the one of the recesses 104a located farther from the frame 107, i.e., at the inner side of the opening 102a, has a smaller thickness than the other one of the recesses 104a located closer to the frame 107. In other words, the recess 104a closer to the frame 107 has a greater width than the recess 104a at the inner side.

With this configuration, in the photomask 101 according to the first embodiment, the substantial refractive index in a position closer to the frame 107 of the opening 102b is lower than the refractive index of the glass 104, i.e., closer to the refractive index of air. In addition, the substantial refractive index gradually increases from the frame 107 toward the inner side of the opening 102b to be gradually closer to the refractive index of the glass 104.

Thus, in exposure using the photomask 101 according to this embodiment, light transmitted by the vicinity of the frame 107 of the opening 102b is refracted toward the inner side the opening 102b more greatly than light transmitted the inner side of the opening 102b, thereby effectively collecting the light.

An example has been described where the translucent substrate 104 included in the photomask 101 is the single glass 104, in which the plurality of recesses 104a with a depth d are formed. However, as shown in the cross-sectional view of FIG. 2, the translucent substrate 104 included in the photomask 101 may be the configuration, in which the high refractive film 105 having a thickness of d and a higher refractive index than the glass 104 is formed on the principal surface of the glass 104, and the plurality of the recesses 105a are formed in the stacked high refractive film 105.

In this variation, in the layer in which the refractive index of light is distributed, the substantial refractive index increases to reach the refractive index of the high refractive film 105. This collects the light more precisely in a desired focal point.

As described above, in this embodiment and the following embodiments, the description of the recesses 104a formed in the glass 104 includes the case where the high refractive film 105 is stacked and the recesses 105a are formed in the stacked high refractive film 105.

Experiment

FIGS. 9-12 illustrate an experimental result of forming the photomask 101 according to the first embodiment in accordance with an exposure wavelength λ of 365 nm, and performing a simulation.

Figure 9:
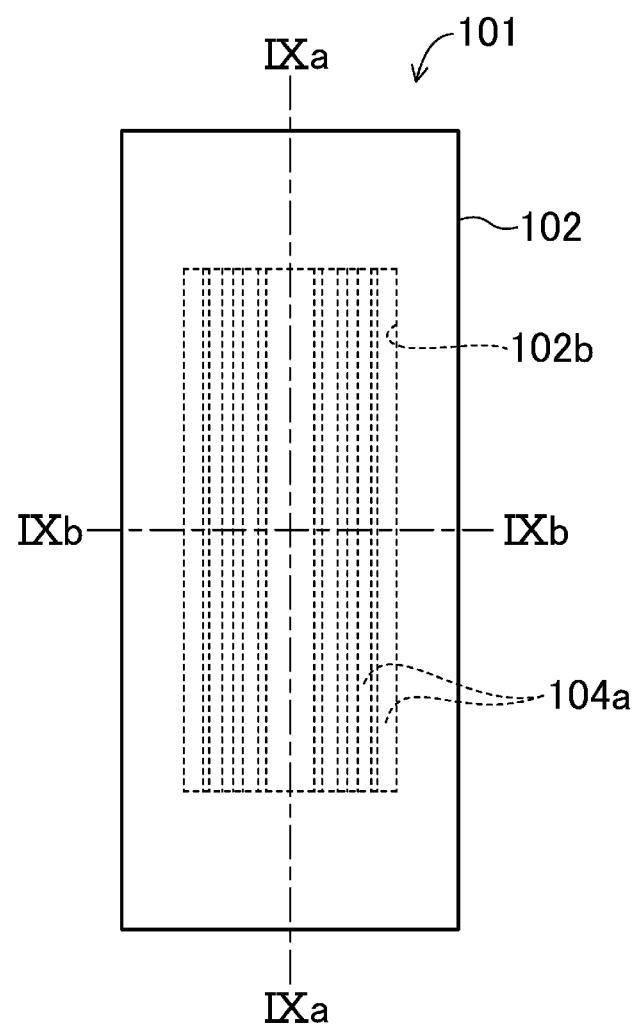
FIG. 9 is a bottom view of an example photomask according to an experiment.

FIG. 9 is a bottom view of the photomask 101. Nine recesses 104a are provided on each side of the line IXa-IXa, which is the center line of the opening 102b in the longitudinal direction. Note that not all the nine recesses 104a are shown in FIG. 9. The recesses 104a are drawn as patterns, which are line-symmetric with respect to the center of the opening 102b, i.e., the line IXa-IXa being the center line of line patterns, along which light is to be collected. This collects the light in a position facing to the line IXa-IXa.

In FIG. 10, numbers are allotted to the nine recesses 104a so that the number gradually increases from the one closest to the line IXa-IXa, i.e., the innermost one, to the outermost one. The table shows the distance between the line IXa-IXa and the center line of each recess 104a, and the width of each recess 104a in numerical order. Since the patterns of the recesses 104a are line-symmetric with respect to the line IXa-IXa, the values in the table represent only the patterns on one side of the line IXa-IXa. While all the recesses 104a have the same depth, the patterns may have different depths.

The depth of the recesses 104a (i.e., the recessing size) is preferably greater than half the wavelength to effectively refract light. Furthermore, light is more reliably refracted in a size greater the wavelength. According to the principles of a gradient index lens, the distance between the photomask 101 and the focal point 116 decreases with an increase in the recessing size. The sizes are indicated by values normalized with the exposure wavelength λ (=365 nm). In exposure with light with a different exposure wavelength, the sizes may be converted using the exposure wavelength λ.

FIG. 11A illustrates a result of optical simulation using the photomask 101 according to this embodiment. FIG. 11A shows intensity distribution of light after being transmitted by the line IXb-IXb of FIG. 9 in the photomask 101, when the photomask 101 is irradiated with the light from the back surface. It is found that the light is refracted when being transmitted by the opening 102b of the photomask 101, and is collected in a position apart from the surface of the photomask 101 and facing the line IXa-IXa.

Figure 12:
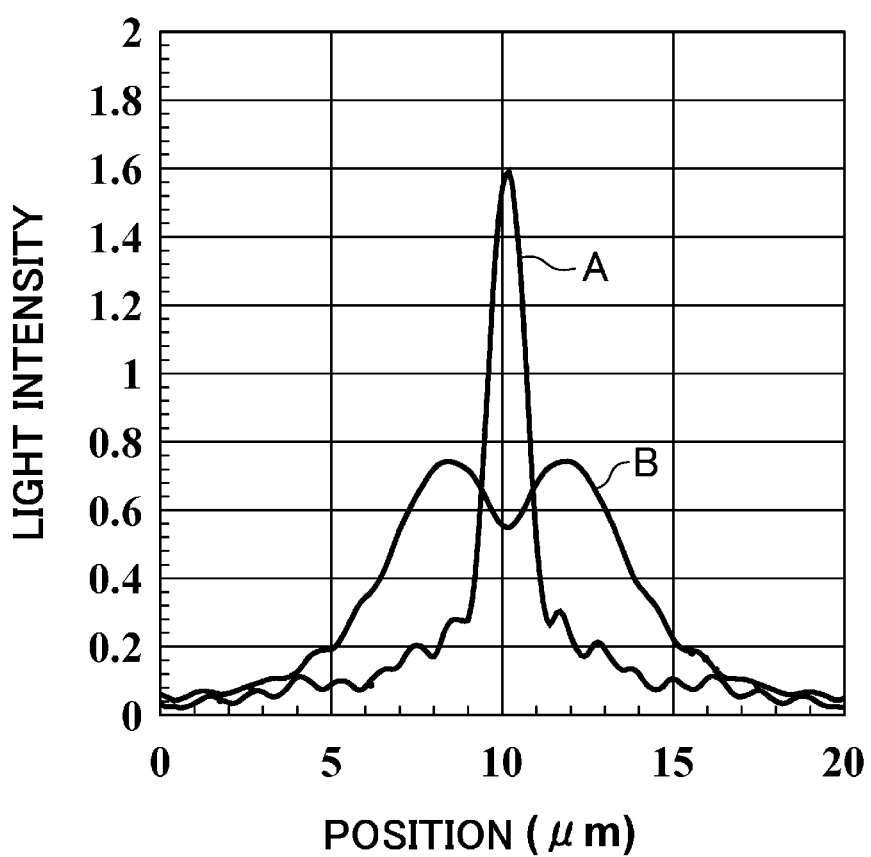
FIG. 12 is a graph illustrating light intensity profiles of the photomask according to the experiment and the comparison example.

FIG. 11B illustrates, as a comparison example, a result of optical simulation where the recesses 104a are not formed in the glass 104. It is found from FIG. 11B that light is not collected in a position facing the line IXa-IXa FIG. 12 illustrates a profile of intensity distribution of light transmitted by the photomask 101 according to this embodiment in a position apart from the photomask 101 only by 27 μm and facing the line IXb-IXb of FIG. 9. In FIG. 12, a profile A is a light intensity profile in using the photomask 101 according to this embodiment. A profile B is a light intensity profile in a comparison example, i.e., in using a conventional photomask.

As described above, it is found from the simulation result according to this embodiment that the configuration according to this embodiment collects light transmitted by the opening 102b of the light-shielding film 102 in an extremely narrow region of, e.g., about 1 μm to form the profile A with the light intensity distribution having a sharp peak. This enables formation of fine patterns of 1 μm by proximity exposure lithography using the photomask 101 according to this embodiment.

While in this simulation, the nine recesses 104a are provided along the single frame 107 on each side to collect light, the recesses 104a may be in any number, as long as it is sufficient to collect light.

The ratio of the width of one of the recesses 104a, which is adjacent to the frame 107, to the width of the recess 104a adjacent to the one of the recesses 104a at the inner side is 0.83. As shown in this example, where a plurality of recesses 104a sufficiently collecting light are arranged, one of a pair of recesses 104a, which is closer to the frame 107, preferably has a size 0.9 times or less the size of the other one, which is at the inner side of the one.

Requirements for providing the advantages of the photomask according to the present disclosure will be briefly described.

The photomask according to the present disclosure is formed by processing the glass 104 with a width of about the exposure wavelength to form substantial refractive index distribution on the glass 104. As described above, in this embodiment, the width of at least one of two adjacent recesses 104a is preferably twice or less the exposure wavelength.

The sum of the width of at least one of two adjacent recesses 104a and the width of the glass layer 104 between the two adjacent recesses is preferably twice or less the exposure wavelength. With this configuration, the substantial refractive index is approximated by a simplified equation using the width of the one of the recesses 104a and the width of the glass 104, thereby facilitating designing of a pattern, which effectively collects light in the focal point 116. At this time, it is more preferable that both the width of the one of the recesses 104a, and the width of the glass layer 104 between the recesses 104a are smaller than or equal to the exposure wavelength.

When the sum of the width of each recess 104a and the width of the glass layer 104 between the recesses 104a is smaller than or equal to the exposure wavelength, the substantial refractive index can be accurately controlled. As a result, a recess pattern capable of precisely collecting light in the focal point 116 is drawn. Specifically, where each of the recesses 104a has a pattern size (width) of T, and the average width of the glass 104 on the both sides of the recess is G, the substantial refractive index in the center of the recesses 104a is precisely represented by the following equation (3). In the equation, n0 is the refractive index of the air layers, which are the recesses 104a, and n1 is the refractive index of the glass layers 104.

$$na=(n1\times G+n0\times T)/(G+T) \quad (3)$$

This is because the substantial refractive index in a certain position between a pair of the recesses 104a is highly precisely expressed by almost linear compensation from the substantial refractive index in a central position between the adjacent pair of the recesses 104a, thereby enabling precise designing of the focal point.

A specific example will be described. For example, in the photomask 101 shown in FIG. 9, assume that the distance from the line IXa-IXa, which is the center line in the longitudinal direction, to the center line of each recess 104a is Tr, the depth of each recess 104a is Td, and the substantial refractive index in the central position between the recesses 104a is expressed by the above equation (3). Based on the equation (1) representing the relationship between the focal point 116 of the gradient index lens and the refractive index distribution, if the pattern sizes of the recesses are formed to satisfy the following equation (4), the photomask 101 is equivalent to the gradient index lens having the focal point 116. That is, the photomask 101 can be easily formed, which precisely has the focal point 116 at a desired distance Tf from the photomask 101. The reference character n0 represents the refractive index of the air layers which are the recesses 104a, and n1 represents the refractive index of the glass layers 104.

$$(n1\times G+n0\times T)/(G+T)=n1-Tr\times Tr/2/Tf/Td \quad (4)$$

In order to collect light transmitted by the opening 102b of the photomask 101, the one of the recesses 104a, which is closest to the frame 107, is preferably located at a distance of the exposure wavelength or less from the frame 107 of the opening 102b. This reduces refraction of light transmitted by the opening 102b from the frame 107 outside the opening 102b. This effectively collects light transmitted by the opening 102b located at the inner side of the opening 102b. Furthermore, the recesses 104a are more preferably in contact with the frame 107.

Second Variation of First Embodiment

Next, a photomask according to a second variation of the first embodiment will be described below with reference to FIG. 13.

Figure 13:
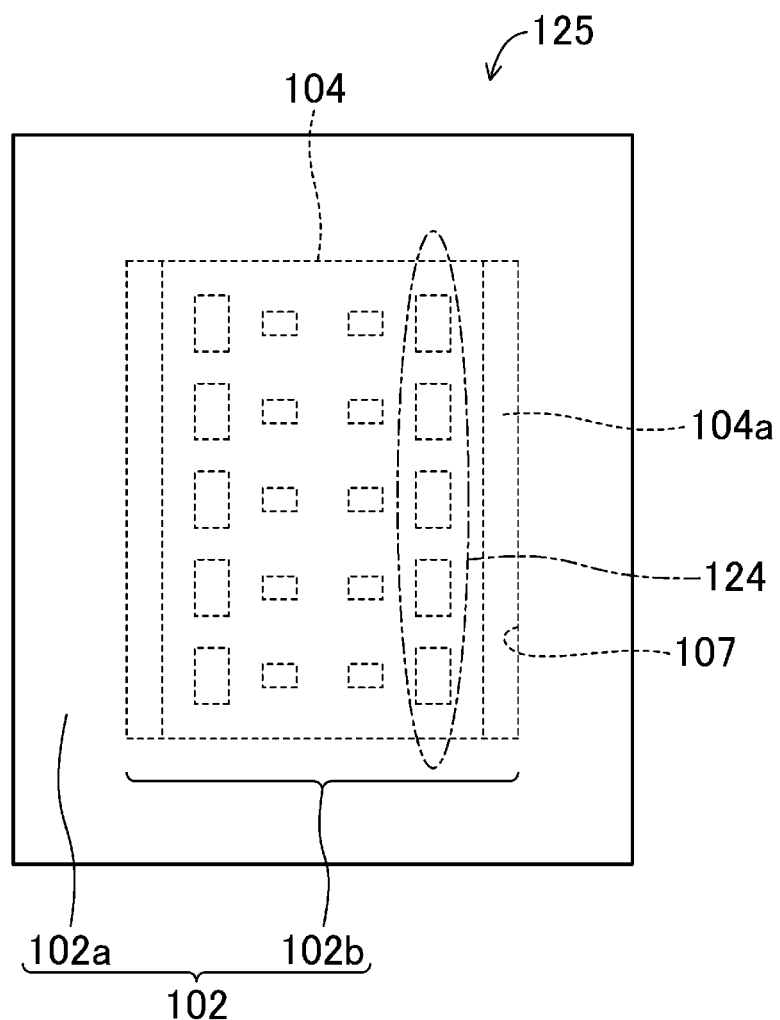
FIG. 13 is a bottom view of an example photomask according to a second variation of the first embodiment.

As shown in FIG. 13, in a photomask 125 according to the second variation, the linear recesses 104a, which are in the second and subsequent positions from the frame 107 to the inside of the opening 102b, are replaced with recess patterns 124, each of which is formed of a group of divided isolated patterns.

In the following description, an exposure pattern, which is the same as that of the photomask 101 shown in FIGS. 1A and 1B, is generated from the photomask 125 shown in FIG. 13 in response to the phenomenon of light refraction.

First, the function of the recess patterns 124 provided in the photomask 125 according to the second variation will be described with reference to FIG. 14.

Figure 14:
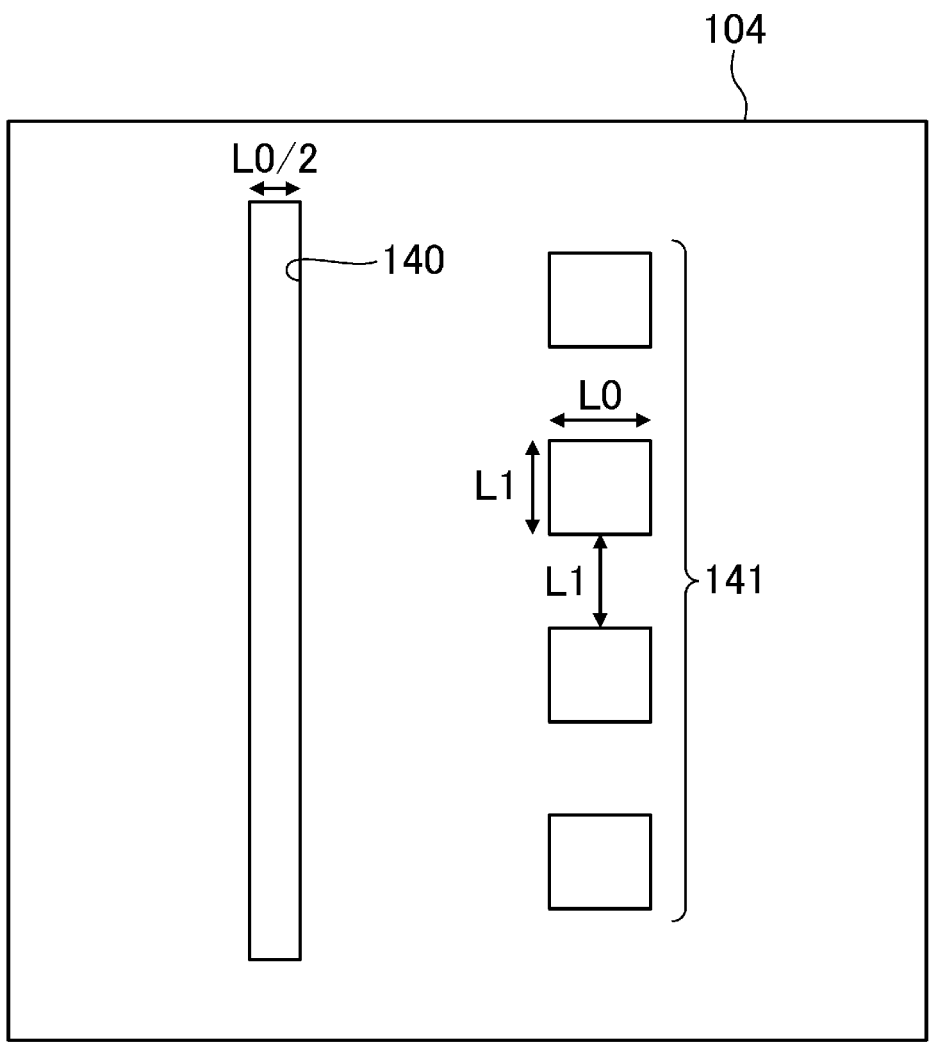
FIG. 14 is a top view illustrating the relationship between a recess pattern formed of a group of patterns and a linear recess pattern.

In FIG. 14, as described above, a second pattern 141 formed by a group of isolated patterns is provided on the light-shielding film 102. If the distance between each pair of the isolated patterns is smaller than or equal to the exposure wavelength, the substantial refractive index can be approximated only by the size ratio. Relative to a size L, which is smaller than or equal to the exposure wavelength, the following two recess patterns are regarded as having equivalent values of light refraction.

First pattern 140: linear recess with a width of L0/2, where L0<L

Second pattern 141: recess formed by linearly arranging square patterns with a width of L0 and a length of L1 at intervals of L1, where L0, L1<L That is, if each of the sizes of the recesses and intervals is smaller than or equal to the exposure wavelength, the group of recesses is not dependent on the shape of the individual recess patterns. Therefore, only the sum of the opening areas of the recess pattern 124 formed of the isolated patterns determines the optical characteristics. At this time, if the patterns of the group are periodically arranged, and each period is smaller than or equal to the exposure wavelength, the recess drawn as the single linear first pattern 140 exemplified by FIG. 14 is equivalent to the recess pattern 124 drawn as a group of the plurality of square patterns.

From the foregoing, the equation of the substantial refractive index na at a given position in the glass 104 is more generally expressed. Specifically, the area of recesses 104a is TS and the area of the glass portion is GS in view of the region at a radius of about the wavelength apart from the given position, the substantial refractive index is approximated by the following equation (5).

$$na=(n1\times GS+n0\times TS)/(GS+TS) \quad (5)$$

Therefore, as shown in FIG. 13, the configuration of this variation reduces the area of the recess pattern 124 formed by a group of patterns at the inner side as compared to the area of the recesses 104a located in the opening 102b in contact with the frame 107. This reduces the substantial refractive index of the glass 104 closer to the frame 107 as compared to that at the inner side of the opening 102b. As a result, the photomask 125 is provided in which light is collected at the inner side of the opening 102b.

In the photomask 101 according to the first embodiment, the widths of the recesses 104a located at the inner side of the opening 102b are smaller than the recesses 104a located closest to the frame 107 of the opening 102b. By contrast, in this variation, there is no need to reduce the widths of the recesses, which are next to the recesses 104a located closest to the frame 107, to the size equal to that in the first embodiment.

Specifically, in FIG. 14, as exemplified by the first pattern 140 and the second pattern 141, the second pattern 141, which has the same function as the first pattern 140 formed with a width of L0/2 as a linear pattern, can be formed with the width of L0. This reduces the minimum sizes of the widths in processing the recesses 104a provided in the photomask 101. As a result, the photomask 125 according to this variation is easily formed.

As described above, the photomask 125 according to this variation provides the same advantages as the photomask 101 according to the first embodiment.

More preferable requirements for obtaining the same advantages as the photomask 101 according to the first embodiment will be briefly described below.

The sizes of the recess patterns 124 of FIG. 13, each of which is formed of a group of patterns, are preferably smaller than or equal to the exposure wavelength. In other words, the area of each pattern forming a pattern group is preferably $\lambda\times\lambda$ or less, where the exposure wavelength is $\lambda$. The distance between each pair of the patterns is preferably smaller than or equal to the exposure wavelength. Furthermore, if the groups of patterns are periodically arranged with a period, which is smaller than or equal to the exposure wavelength, the photomask 125 equivalent to the photomask 101 according to the first embodiment can be provided.

While in FIG. 13, the isolated patterns forming each pattern group have rectangular planer shapes, the shape is not limited thereto as long as they have the above-described configuration.

The distance between each of the recess patterns 124, which is a group of patterns, and the corresponding linear recess 104a is preferably smaller than or equal to the exposure wavelength. This is similar to the first embodiment. The width of the linear recesses 104a is preferably smaller than or equal to the exposure wavelength. This is similar to the first embodiment, as well.

Third Variation of First Embodiment

In the above-described second variation, the recesses 104a closest to the frame 107, i.e., the outermost recesses 104a have a linear shape. However, the shape is not limited thereto. The outermost recesses 104a may be groups of patterns.

Figure 15:
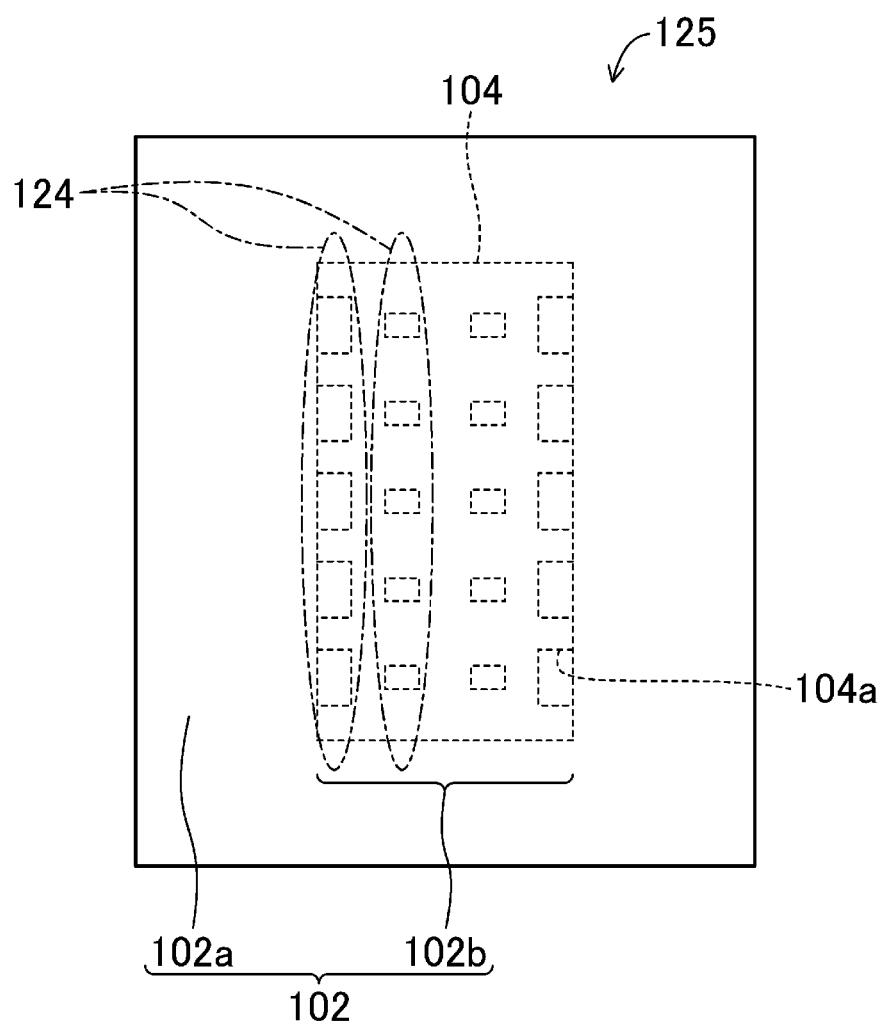
FIG. 15 is a bottom view of an example photomask according to a third variation of the first embodiment.

An example of this case is shown in FIG. 15 as a third variation of the first embodiment.

As shown in FIG. 15, a pair of recess patterns 124, each of which is a group of patterns, is provided along the frame 107 of the opening 102b. Each isolated pattern of the recess patterns 124 has an area of λ×λ or smaller, where the exposure wavelength is λ. The distance between each pair of patterns is also smaller than or equal to the exposure wavelength λ.

In each pair of recess patterns 124, the one isolated pattern, which is located at the inner side, has a smaller area than the other isolated pattern, which is located closer to the frame 107.

This configuration reduces the substantial refractive index at the frame 107 as compared to that at the inner side, thereby providing the photomask 125 collecting light at the inner side of the opening 102b.

In the above-described configuration, the recess pattern 124 located at the inner side has a smaller total area than the recess pattern 124 located closer to the frame 107 of the opening 102b. For example, the total area of the inner recess pattern 124 is about 0.9 times or less the total area of the outer recess pattern 124. This sufficiently collects light, similar to the first embodiment.

As described above, with the use of the photomask 125 according to the third variation, light is substantially collected in the opening 102b in any shape.

Fourth Variation of First Embodiment

An example photomask 126, which collects light in an opening 102b in any shape not limited to a linear shape, will be described below as a fourth variation of the first embodiment with reference to FIGS. 16A and 16B.

Figure 16A:
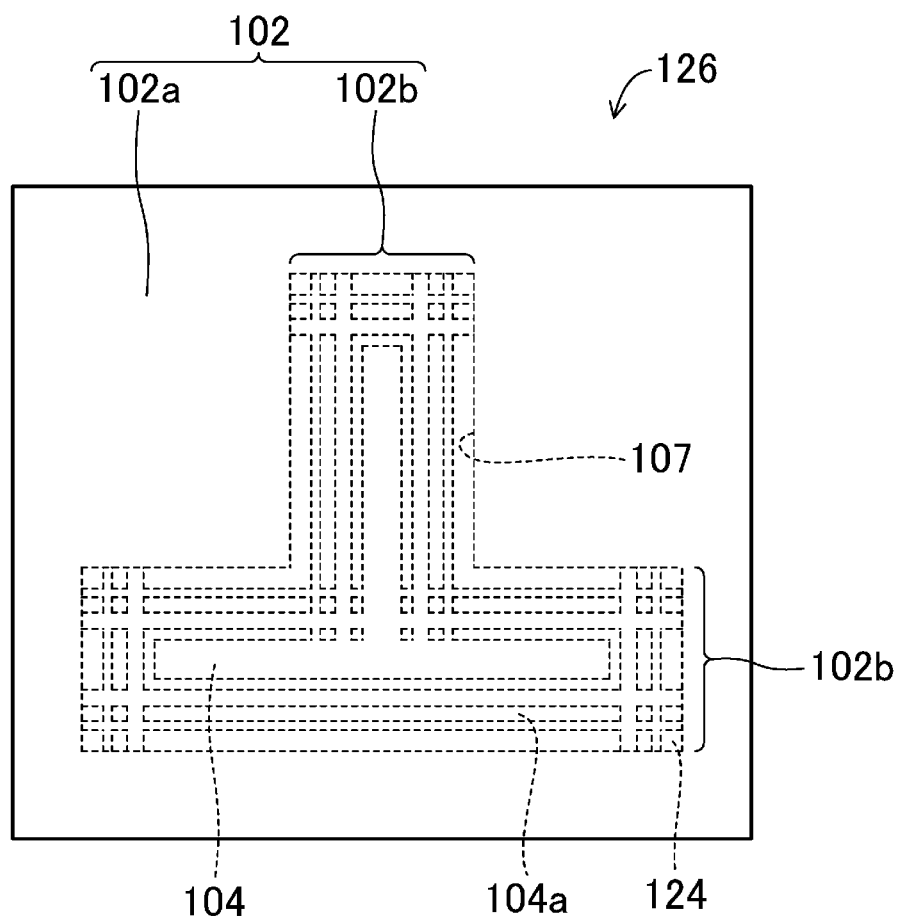
FIG. 16A is a bottom view of an example photomask according to a fourth variation of the first embodiment.
Figure 16B:
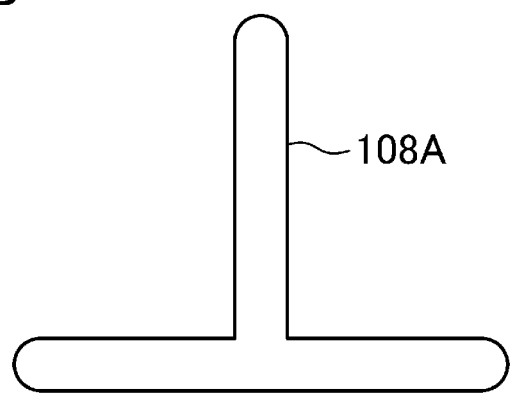
FIG. 16B is a top view of a pattern formed by using the photomask according to the fourth variation.

As shown in FIGS. 16A and 16B, the photomask 126 according to the fourth variation collects light, which is transmitted to the opening 102b in any shape, while retaining the shape of a frame 107.

Specifically, as shown in FIG. 16A, in the photomask 126 according to the fourth variation, linear recesses 104a are provided along the frame 107 of linear portion of the opening 102b. At each corner of the opening 102b, a recess pattern 124 is provided, which is a group of patterns. Each of the patterns has an area of λ×λ or smaller, where the wavelength size is λ. The widths or areas of the recess patterns 124 with the size of λ×λ or smaller gradually decrease from the frame 107 of the opening 102b to the inner side of the opening 102b. That is, out of the recess patterns 124 with the size of λ×λ or smaller, the pattern at the inner side of the opening 102b has a smaller area than the pattern closer to the frame 107.

With this configuration, in the photomask 126 according to the fourth variation, light is collected in the opening 102b in any shape, while retaining the external shape of the opening 102b. That is, a pattern 108A having the shape of FIG. 16B can be formed by exposure using the photomask 126 shown in FIG. 16A.

Fifth Variation of First Embodiment

The recess patterns 124 are not necessarily provided throughout the entire glass 104 exposed from the opening 102b, and may be provided in a position in which light is to be collected.

Figure 17A:
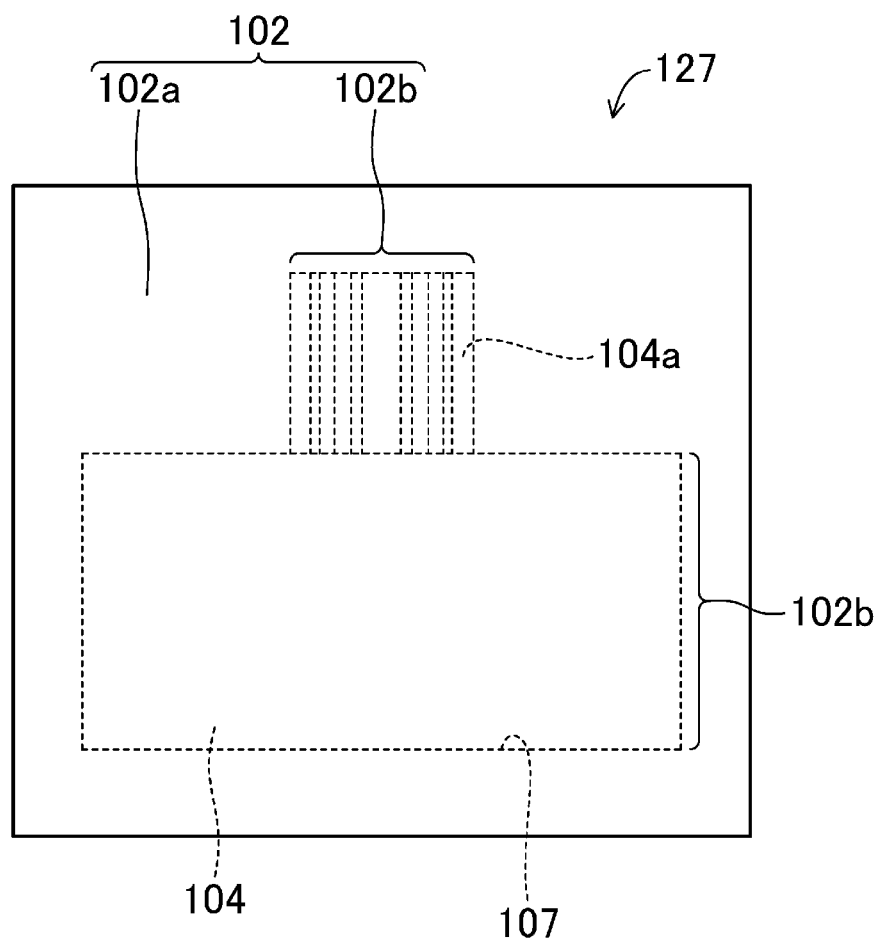
FIG. 17A is a bottom view of an example photomask according to a fifth variation of the first embodiment.
Figure 17B:
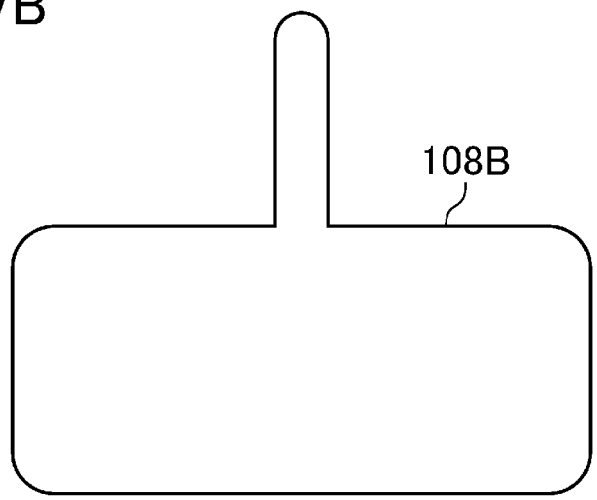
FIG. 17B is a top view of a pattern formed by using the photomask according to the fifth variation.

For example, as shown in FIG. 17A, in a photomask 127 of a fifth variation of the first embodiment, recesses 104a are provided only in a part of a glass 104 exposed from the opening 102b. With this configuration, as shown in FIG. 17B, light is collected in the region of the glass 104 provided with the recesses 104a, thereby forming a pattern 108B collecting light transmitted by the opening 102b with the recesses 104a. On the other hand, since the region without the recesses 104a is a normal glass 104, a pattern is transferred without collecting light.

Second Embodiment

A photomask according to a second embodiment will be described below with reference to the drawings.

The photomask according to the second embodiment is used to form a plurality of light-collecting patterns from light transmitted by an opening of a light-shielding film. In the second embodiment, the same reference characters as those shown in the first embodiment are used to represent equivalent elements.

Figure 18A:
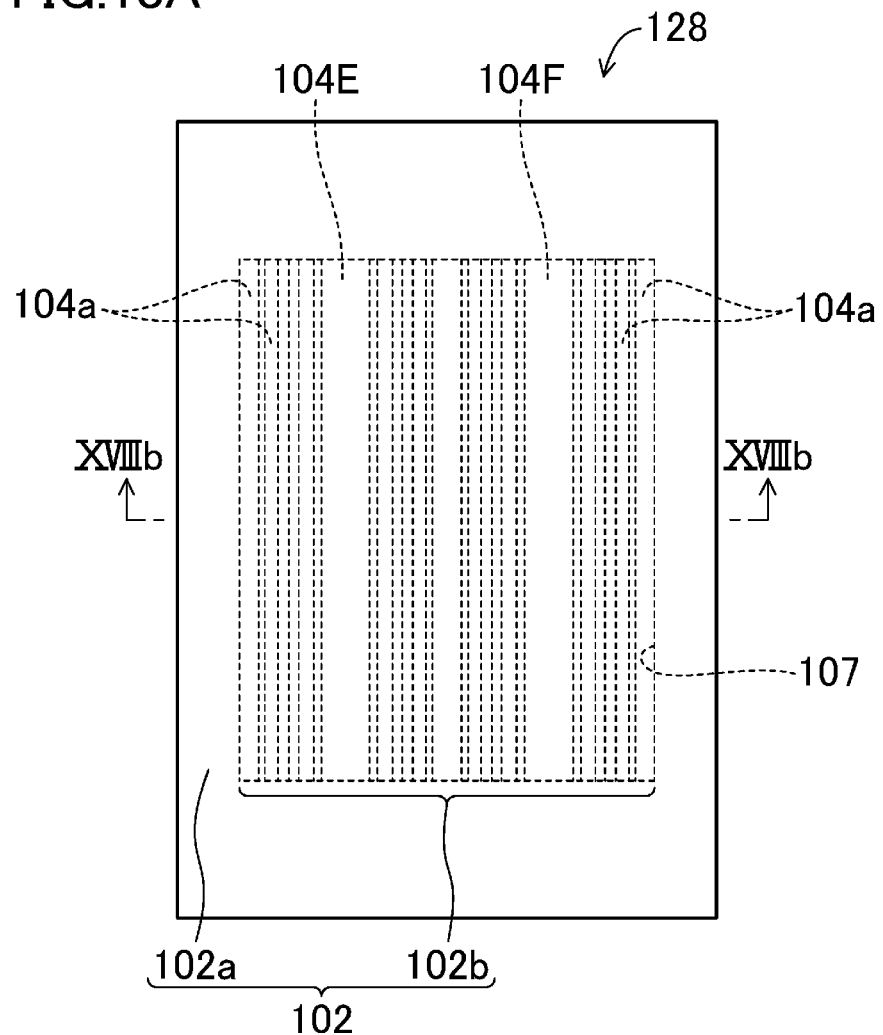
FIGS. 18A and 18B illustrate an example photomask according to a second embodiment.
Figure 18B:
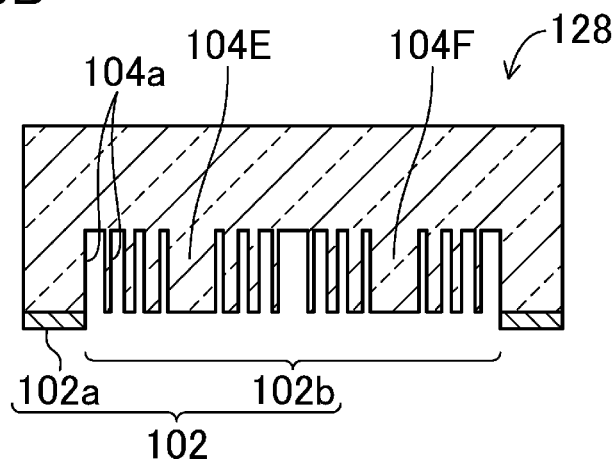

As shown in FIGS. 18A and 18B, a photomask 128 according to the second embodiment includes a translucent substrate 104 made of, for example, glass, and a light-shielding film 102, which is formed under the translucent substrate 104, and includes a light-shielding portion 102a and an opening 102b serving as a translucent region.

In the photomask 128 according to the second embodiment, a plurality of linear recesses 104a with different widths are provided in a region of the glass 104 which is exposed from the opening 102b. Specifically, in the surface of the glass 104 exposed from the opening 102b, linear glass portions 104E and 104F are provided in the positions corresponding to two desired light-collecting patterns. The plurality of linear recesses 104a with different widths are provided along the glass portions 104E and 104F.

The widths of the recesses 104a gradually increase with an increase in a distance from each center line of the glass portions 104E and 104F in the longitudinal direction. That is, due to the at least two recesses 104a provided along the two desired patterns, the substantial refractive index gradually decreases with an increase in the distance from each center line of the glass portions 104E and 104F. The light, which is transmitted by the vicinity of the recesses 104a close to the centers of the glass portions 104E and 104F, is little refracted toward the center lines of the glass portions 104E and 104F. On the other hand, the light, which is transmitted by the vicinity of the recesses 104a apart from the centers of the glass portions 104E and 104F, is largely refracted. The refracted light is collected toward the center lines of the glass portions 104E and 104F.

Figure 19A:
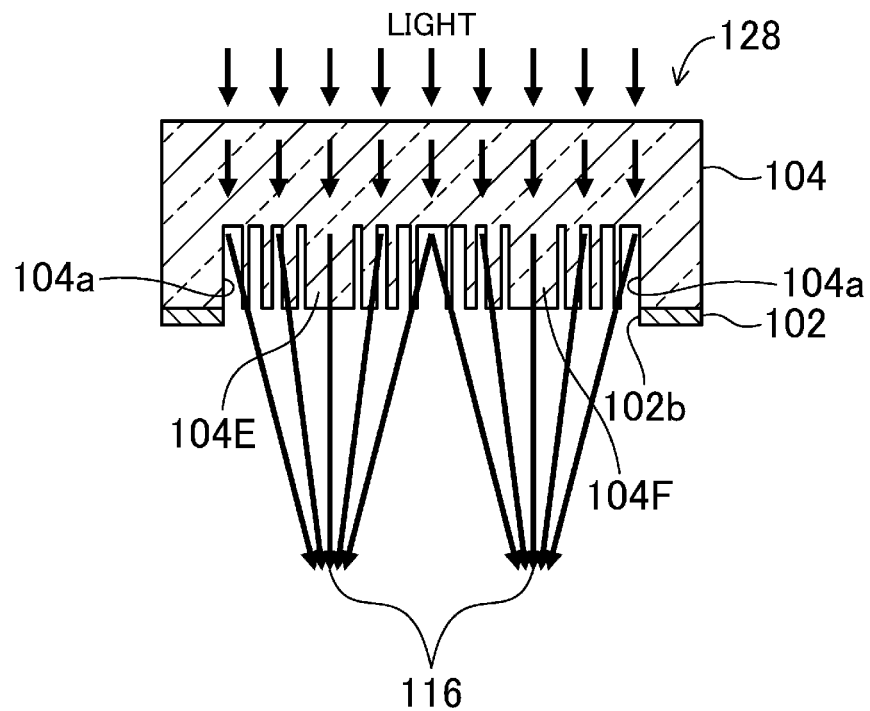
FIG. 19A is a cross-sectional view illustrating collection of exposure light using the photomask according to the second embodiment.
Figure 19B:
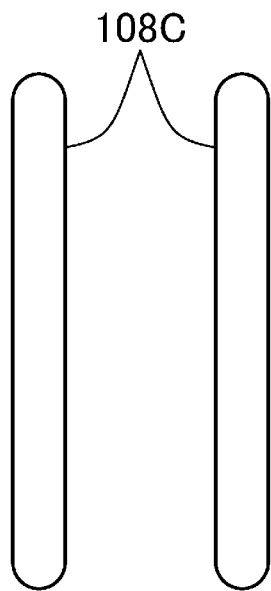
FIG. 19B is a top view of a pattern formed by using the photomask according to the second embodiment.

FIG. 19A illustrates that light is refracted and focused in two focal points 116 when the photomask 128 is irradiated with the light from the back surface. FIG. 19B illustrates two linear patterns 108C obtained by exposing the photomask 128 to light.

The points of the second embodiment will be described hereinafter with reference to the photomask 128 according to the second embodiment shown in FIGS. 18A-19B.

In the photomask 128 shown in FIGS. 18A and 18B, the recesses 104a forming a plurality of patterns (two patterns in this embodiment) are provided in the region of the glass 104 exposed from the opening 102b of the light-shielding film 102. The recesses 104a are arranged on the both sides of the glass portions 104E and 104F corresponding to the desired patterns. In this embodiment, the recesses 104a, each of which has a two or more lines, are arranged in parallel along the glass portions 104E and 104F.

In each adjacent pair of the recesses 104a, the recesses 104a farther from the glass portion 104E has a greater width than the recesses 104a closer to the glass portion 104E. Similarly, the recesses 104a farther from the glass portion 104F has a greater width than the recesses 104a closer to the glass portion 104F.

This configuration increases the substantial refractive index at positions close to the glass portions 104E and 104F, which correspond to the desired patterns, to the substantial refractive index of glass. On the other hand, the substantial refractive index at positions far from the glass portions 104E and 104F is reduced.

Therefore, light is effectively collected in the glass portions 104E and 104F corresponding to the desired patterns in exposure using the photomask 128 according to this embodiment.

In the second embodiment, it is preferable that the substantial refractive index in the glass portions 104E and 104F corresponding to the desired patterns sufficiently increases as high as that of glass. That is, the widths of the glass portions 104E and 104F are preferably greater than or equal to the exposure wavelength. Furthermore, the widths of the glass portions 104E and 104F are preferably twice or more the exposure wavelength.

In order to effectively collect light, the sum of the distance between each pair of the recesses 104a (i.e., the width of the glass portion) and the width of one of an adjacent pair of the recesses 104a, which are provided in parallel along the glass portions 104E and 104F corresponding to the desired patterns, is preferably twice or less the exposure wavelength. This is similar to the first embodiment.

If the sum of the width of one of the pair of the recesses 104a and the distance between the pair of the recesses 104a (i.e., the width of the glass portion) is smaller than or equal to the exposure wavelength, a recess pattern collecting light in the focal points 116 is more precisely drawn. This is similar to the first embodiment, as well.

As described above, with the use of the photomask 128 according to the second embodiment, a plurality of light-collecting patterns are formed in any portion of the exposed region of the photomask 128.

Variation of Second Embodiment

In the second embodiment, an example has been described where the recesses 104a have a linear planar shape. Similar to the second and third variations of the first embodiment, the recesses 104a located on the both sides of the glass portions 104E and 104F corresponding to the desired patterns may be replaced with recess patterns 124, each of which is a group of isolated patterns so that the substantial refractive index gradually decrease with an increase in a distance from the glass portions 104E and 104F. As a result, a light-collecting pattern in any shape can be formed.

Figure 20A:
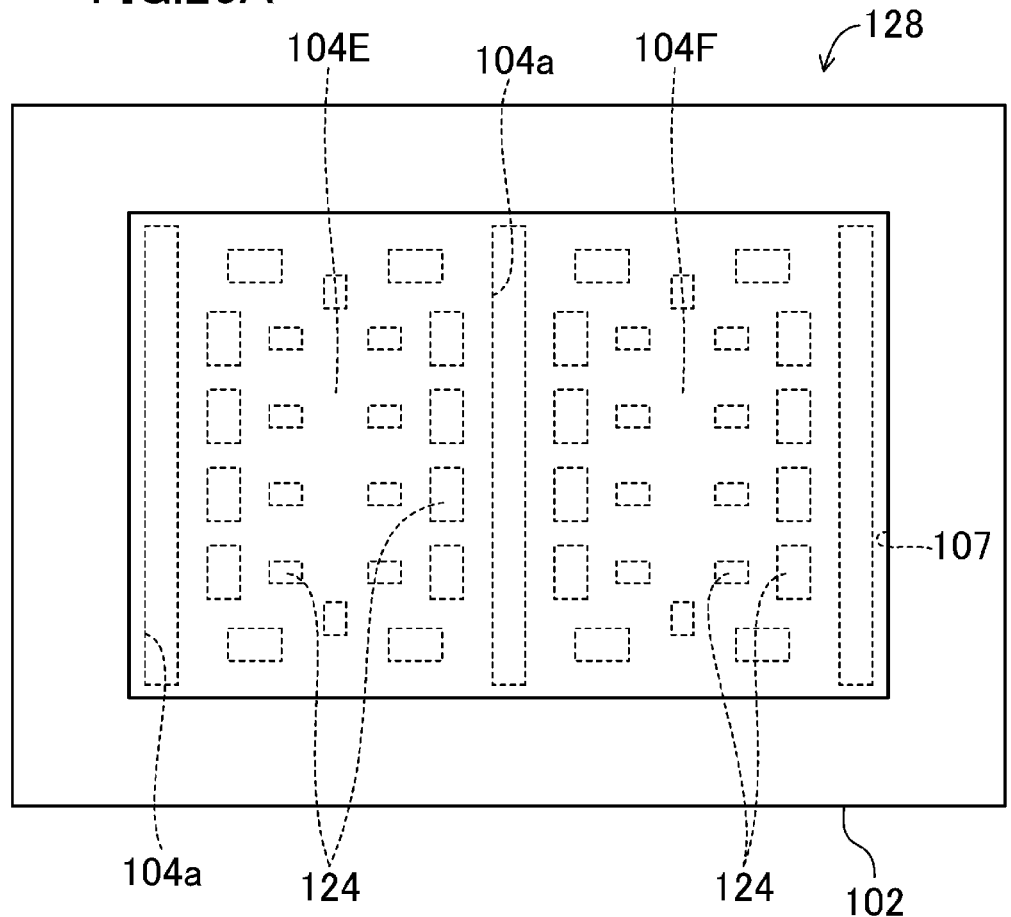
FIG. 20A is a bottom view of an example photomask according to a variation of the second embodiment.
Figure 20B:
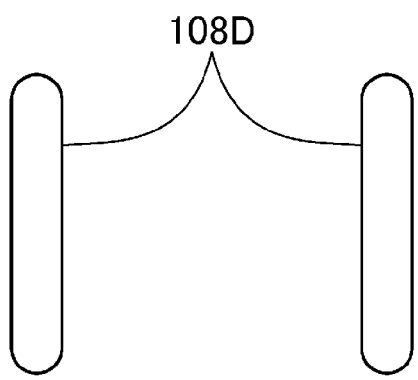
FIG. 20B is a top view of a pattern formed by using the photomask according to the variation.

Specifically, as shown in FIGS. 20A and 20B, assume that the recess patterns 124 with an area of $\lambda \times \lambda$ or smaller, where the exposure wavelength is $\lambda$, are provided at the both sides of the glass portions 104E and 104F corresponding to the desired patterns. The patterns are formed so that the recess patterns 124 located closer to the glass portions 104E and 104F have a greater area than the recess pattern 124 located farther from the glass portions 104E and 104F. With this configuration, two patterns 108D shown in FIG. 20B are formed.

As described above, with the use of the photomasks 128 according to the second embodiment and the variation, a light-collecting pattern in any shape can be formed in any position of the exposed region of the photomask 128.

Third Embodiment

A pattern formation method according to a third embodiment using a photomask according to the present disclosure will be described below with reference to FIGS. 21A-21D. In the pattern formation method according to this embodiment, the photomasks according to the first embodiment and the variations, and the second embodiment and the variation are used.

Figure 21A:
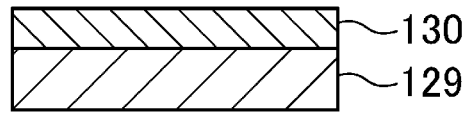
FIGS. 21A-21D are cross-sectional views illustrating the steps of a pattern formation method according to a third embodiment in order of steps.

First, as shown in FIG. 21A, for example, a film 130 to be processed, which is a metal film, an insulating film, etc., is formed on a wafer 129, which is a substrate to be exposed to light.

Figure 21B:
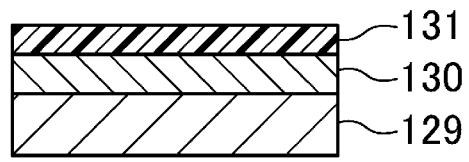

Then, as shown in FIG. 21B, for example, a positive resist film 131 is applied onto the film 130 to be processed to form a film.

Figure 21C:
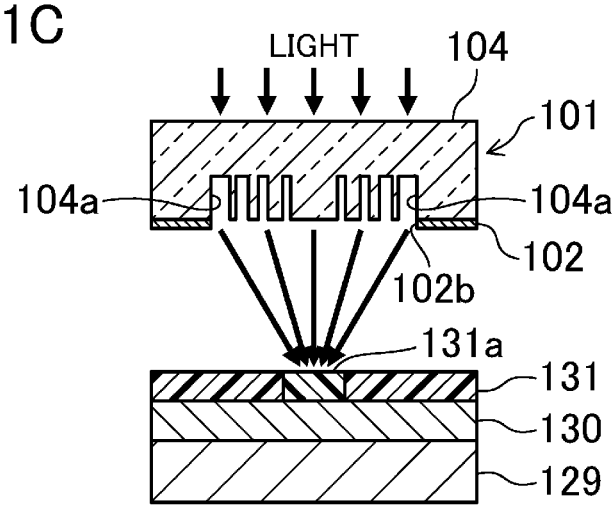

Next, as shown in FIG. 21C, for example, the photomask 101 according to the first embodiment shown in FIG. 1B is irradiated with exposure light, and the resist film 131 is exposed to light transmitted by the photomask 101. As described above, the recesses 104a for collecting the light transmitted by the photomask 101 are formed in the opening 102b of the photomask 101.

In the exposure shown in FIG. 21C, the resist film 131 is exposed to light from an exposure light source. At this time, the exposure light transmitted by the photomask 101 is collected above the substrate 129. Then, in the next step of development, the resist film 131 is irradiated with exposure energy sufficient to dissolve the resist film 131.

Figure 21D:
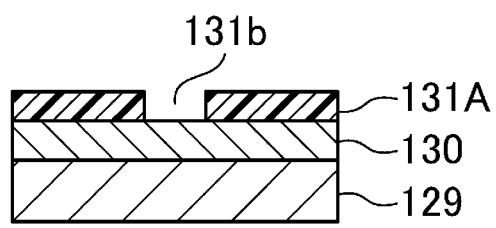

After that, as shown in FIG. 21D, the exposed resist film 131 is developed to remove an exposed latent portion 131a of the resist film 131, thereby forming a resist pattern 131A having a fine opening pattern 131b.

The pattern formation method according to the third embodiment provides the same advantages as the first embodiment. Specifically, proximity exposure is performed on the wafer 129 applied with the resist film 131 via the photomask 101 according to the present disclosure. At this time, the recesses 104a provided in the opening 102b of the photomask 101 collect light transmitted by the photomask 101, thereby forming a pattern having the fine opening pattern 131b.

While in this embodiment, the positive resist process is used, a negative resist process may be used to provide similar advantages.

Fourth Embodiment

In the above-described embodiments, the exposure using mask plates has been described, the exposure is not limited thereto. For example, the present disclosure is also applicable to exposure using, for example, a roller-shaped photomask.

An exposure apparatus including a roller-shaped photomask 133 will be described below with reference to FIGS. 22A and 22B.

Figure 22A:
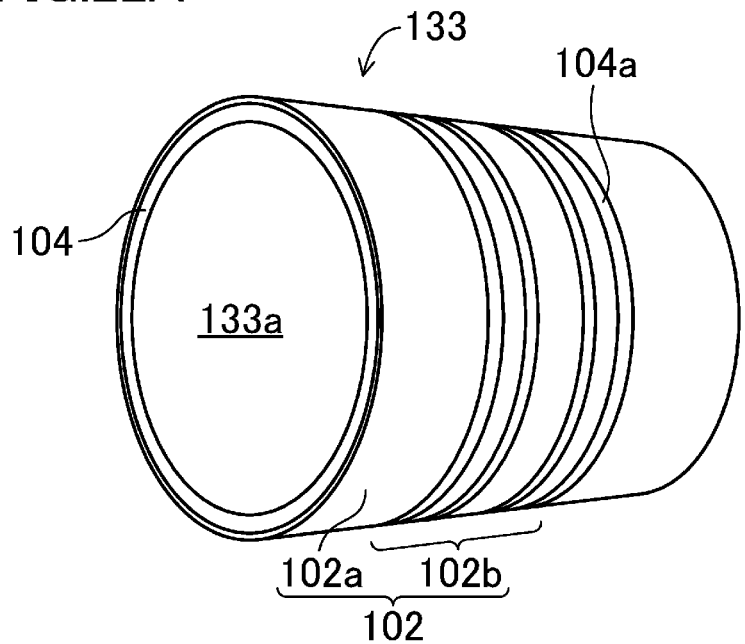
FIG. 22A is a schematic perspective view of an exposure apparatus using a roller-shaped photomask according to a fourth embodiment.

FIG. 22A illustrates the roller-shaped photomask 133. The roller-shaped photomask 133 has a cylindrical shape. The inside of the cylinder is a hollow 133a. The inner side of the sidewall of the cylinder is a translucent substrate made of, for example, a glass 104. A light-shielding film 102 including a light-shielding portion 102a and an opening 102b is formed on the surface of the outer side of the sidewall. A mask pattern is formed in the portion of the glass 104 exposed from the opening 102b. The mask pattern includes the glass 104 and the recesses 104a formed by selectively recessing the glass 104. The opening 102b of the light-shielding film 102 and the glass portion 104 formed with the recesses 104a have the configurations as in any one of photomask 101, or 125-128 in the above-described embodiments.

Figure 22B:
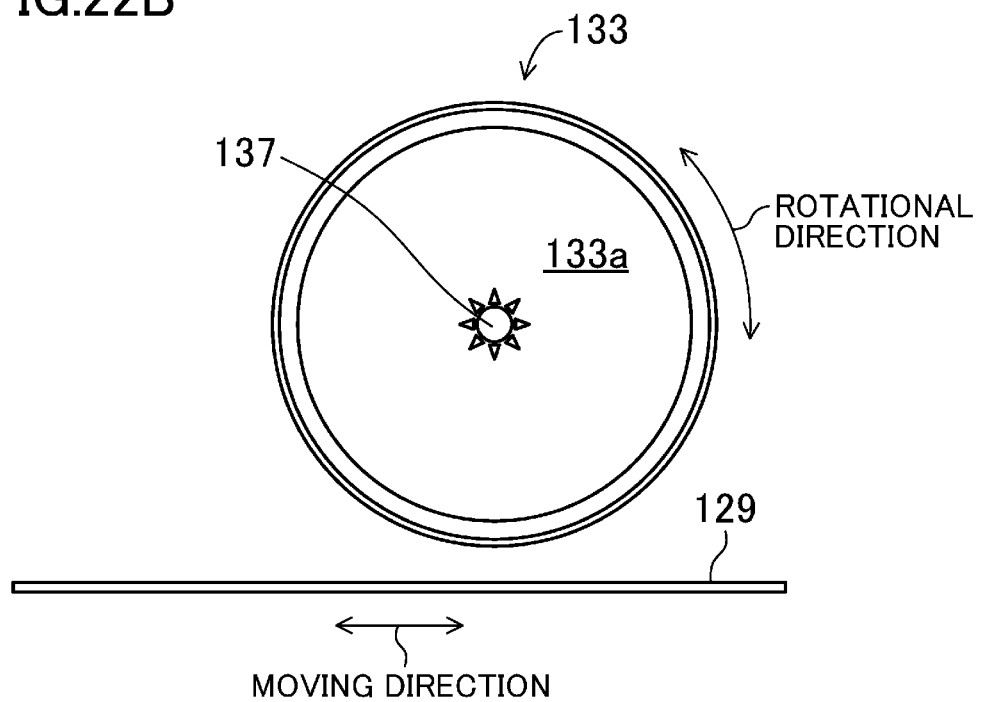
FIG. 22B is a schematic side view of the exposure apparatus using the roller-shaped photomask according to the fourth embodiment.
Figure 23:
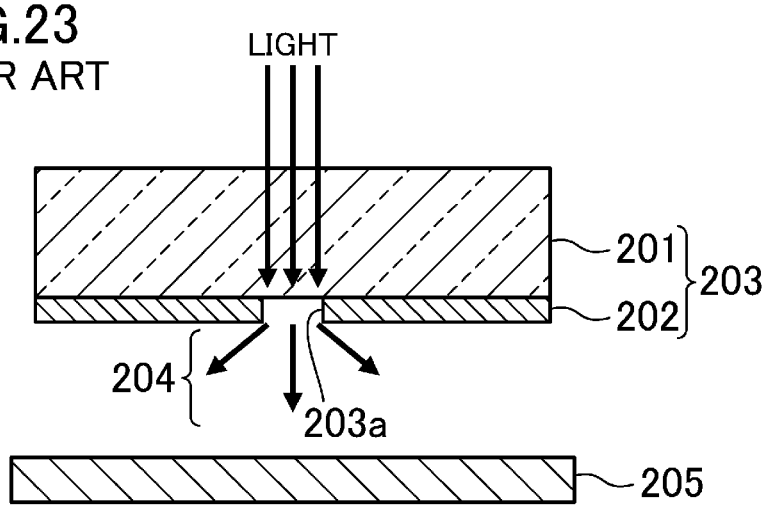
FIG. 23 is a schematic cross-sectional view illustrating problems in conventional proximity exposure or same-size projection exposure.
Figure 24A:
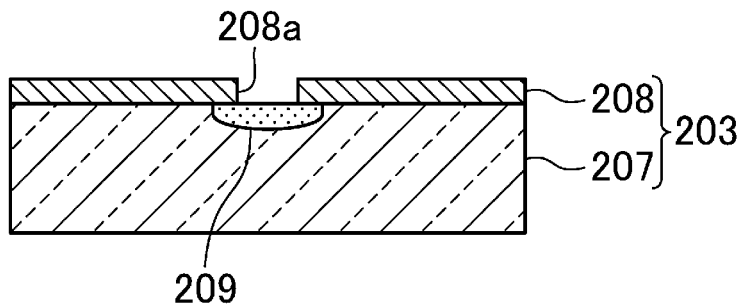
FIG. 24A is a cross-sectional view of a photomask including a high refractive region in part of a conventional glass substrate.
Figure 24B:
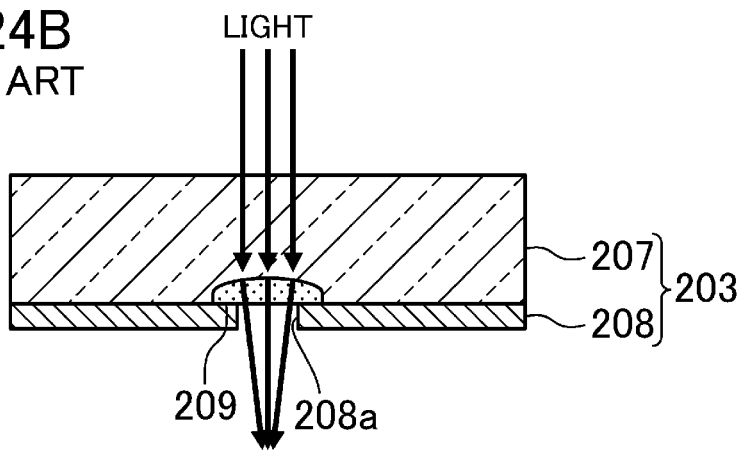
FIG. 24B is a cross-sectional view illustrating proximity exposure or same-size projection exposure using the photomask including the high refractive region in part of the conventional glass substrate.

Next, FIG. 22B illustrates the exposure apparatus including the roller-shaped photomask 133 and the operation of the apparatus. FIG. 22B is a side view as seen from one end surface of the cylindrical photomask 133. A light source 137 is provided in the hollow 133 a, which is the inside of the cylinder.

A substrate 129 to be exposed to light is provided below the roller-shaped photomask 133. In addition, the photomask 133 according to this embodiment is rotatable around the light source 137. The substrate 129 is movable from side to side (i.e., in the horizontal direction) of the drawing.

At this time, a mechanism for exposing the substrate 129 to light to transfer a pattern drawn on the sidewall of the cylinder to the substrate 129 by synchronizing the rotational speed of the cylindrical photomask 133 with the moving speed of the substrate 129 is also included.

In the exposure apparatus according to this embodiment, the recesses 104a are formed in the exposed portion of the light-shielding film 102 of the roller-shaped photomask 133, thereby collecting light transmitted by the photomask 133 at a predetermined distance apart from the photomask 133. As a result, a fine pattern can be formed in a large area.

As described above, according to the present disclosure, light transmitted by a photomask is collected at a predetermined distance apart from the photomask, and a pattern is formed in a size smaller than a limit size formed with a conventional photomask, even in simple exposure such as proximity exposure. A transferred image is formed in a predetermined focal point by utilizing the function of a recess pattern as a lens. Therefore, a light-collecting image is formed even in same-size projection exposure to an opening in a small size which does not transmit light with sufficient intensity in a conventional technique, thereby forming a fine pattern.

With the use of the photomask according to the present disclosure, and the pattern formation method and the exposure apparatus using the photomask, a pattern can be formed in a size smaller than a limit size, which can be formed with a conventional photomask, even in simple exposure such as proximity exposure. This enables microfabrication at low costs. Since the proximity exposure and same-size projection exposure capable of microfabrication are easily applicable to large-area processing, the present disclosure is useful for microfabrication etc. of not only semiconductor devices but also large-area elements such as image panels and energy elements for solar power generation, etc. at low costs.

What is claimed is:

1. A photomask comprising:
   a translucent substrate; and
   a light-shielding film formed on the substrate, and including a light-shielding portion and an opening which serves as a translucent region, wherein
   a plurality of recesses are formed in a region of the substrate, which is exposed from the opening,
   widths of the plurality of recesses gradually increase with an increase in distances from a focal point so that light transmitted by the plurality of recesses is focused in a predetermined position.

2. The photomask of claim 1, wherein
   the plurality of recesses are linearly patterned along two facing sides of the opening, and
   a first recess of an adjacent pair of the recesses, which is closer to a boundary between the light-shielding portion and the opening has a greater width than a second recess, which is farther from the boundary.

3. The photomask of claim 2, wherein
   the width of the second recess is 0.9 times or less the width of the first recess.

4. The photomask of claim 2, wherein
   the width of the first recess is twice or less an exposure wavelength.

5. The photomask of claim 2, wherein
   the width of the second recess is smaller than or equal to an exposure wavelength.

6. The photomask of claim 2, wherein
   the width of the first recess and the width of the second recess are smaller than or equal to an exposure wavelength.

7. The photomask of claim 2, wherein
   a distance between the first and the second recesses is smaller than or equal to an exposure wavelength.

8. The photomask of claim 2, wherein
   a sum of a distance between the first and the second recesses and the width of the second recess is smaller than or equal to an exposure wavelength.

9. The photomask of claim 2, wherein
   a distance between the first recess and the boundary is smaller than or equal to an exposure wavelength.

10. The photomask of claim 2, wherein
    the first recess is in contact with the boundary.

11. The photomask of claim 1, wherein
    a first recess of the plurality of recesses is linearly patterned along two facing sides of the opening,
    each of second recesses of the plurality of recesses is formed of a group of patterns, each of which has an area of $\lambda \times \lambda$ or less, where $\lambda$ is an exposure wavelength,
    the first recess is located closer to a boundary between the light-shielding portion and the opening, and
    the second recesses are located farther from the boundary with the first recess interposed therebetween.

12. The photomask of claim 11, wherein
    a distance between each adjacent pair of the second recesses is smaller than or equal to an exposure wavelength.

13. The photomask of claim 11, wherein
    a distance between an adjacent pair of the first and second recesses is smaller than or equal to an exposure wavelength.

14. The photomask of claim 11, wherein
    a distance between the first recess and the boundary is smaller than or equal to an exposure wavelength.

15. The photomask of claim 1, wherein
    each of the plurality of recesses is formed of a group of patterns, each of which has an area of $\lambda \times \lambda$ or less, where $\lambda$ is an exposure wavelength,
    a first recess of the plurality of recesses has a greater total area than a second recess of the plurality of recesses,
    the first recess is located closer to a boundary between the light-shielding portion and the opening, and
    the second recess is located farther from the boundary with the first recess interposed therebetween.

16. The photomask of claim 15, wherein
    a distance between an adjacent pair of the first and second recesses is smaller than or equal to an exposure wavelength.

17. A photomask comprising:

a translucent substrate; and a light-shielding film formed on the substrate, and including a light-shielding portion and an opening which serves as a translucent region, wherein a plurality of recesses are formed in a region of the substrate, which is exposed from the opening, widths of first recesses of the plurality of recesses gradually increase with an increase in distances from a first focal point so that light transmitted by the first recesses is focused in a predetermined position, and widths of second recesses of the plurality of recesses gradually increase with an increase in distances from a second focal point, which is different from the first focal point, so that light transmitted by the second recesses is focused in another predetermined position.

18. The photomask of claim 17, wherein the plurality of recesses are linearly patterned along two facing sides of the opening, one of an adjacent pair of the first recesses, which is closer to a boundary between the light-shielding portion and the opening, has a greater width than the other one, which is farther from the boundary, and one of an adjacent pair of the second recesses, which is closer to the boundary, has a greater width than the other one, which is farther from the boundary.

19. The photomask of claim 17, wherein each of the plurality of recesses is formed of a group of patterns, each of which has an area of $\lambda \times \lambda$ or less, where $\lambda$ is an exposure wavelength, one of an adjacent pair of the first recesses, which is closer to a boundary between the light-shielding portion and the opening, has a greater total area than the other one, which is farther from the boundary, and one of an adjacent pair of the second recesses, which is closer to the boundary, has a greater total area than the other one, which is farther from the boundary.

20. The photomask of claim 1, wherein depths of the recesses are greater than half an exposure wavelength.

21. A pattern formation method using the photomask of claim 1, the method comprising:

forming a resist film on a substrate to be exposed to light;

irradiating the resist film with exposure light via the photomask; and forming a resist pattern by developing the resist film irradiated with the exposure light.

22. An exposure apparatus using the photomask of claim 1, the photomask being a cylindrical mask substrate, in which a hollow having a light source of exposure light inside is provided, the apparatus comprising:

a rotation mechanism configured to rotate the photomask; and a transfer mechanism configured to transfer a substrate to be exposed to light relative to the photomask, wherein the substrate to be exposed to light is exposed, while the rotation mechanism rotates the photomask, and the transfer mechanism transfers the substrate to be exposed to light.

23. The photomask of claim 17, wherein depths of the recesses are greater than half an exposure wavelength.

24. A pattern formation method using the photomask of claim 17, the method comprising:

forming a resist film on a substrate to be exposed to light;

irradiating the resist film with exposure light via the photomask; and forming a resist pattern by developing the resist film irradiated with the exposure light.

25. An exposure apparatus using the photomask of claim 17, the photomask being a cylindrical mask substrate, in which a hollow having a light source of exposure light inside is provided, the apparatus comprising:

a rotation mechanism configured to rotate the photomask; and a transfer mechanism configured to transfer a substrate to be exposed to light relative to the photomask, wherein the substrate to be exposed to light is exposed, while the rotation mechanism rotates the photomask, and the transfer mechanism transfers the substrate to be exposed to light.

* * * * *